United States Patent
Palmstrom et al.

(10) Patent No.: US 11,462,688 B2
(45) Date of Patent: Oct. 4, 2022

(54) OPTOELECTRONIC DEVICES AND METHODS OF MAKING THE SAME

(71) Applicant: Alliance for Sustainable Energy, LLC, Golden, CO (US)

(72) Inventors: Axel Finn Palmstrom, Golden, CO (US); Tomas Leijtens, Emerald Hills, CA (US); Joseph Jonathan Berry, Boulder, CO (US); David Todd Moore, Lakewood, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 187 days.

(21) Appl. No.: 16/585,843

(22) Filed: Sep. 27, 2019

(65) Prior Publication Data
US 2020/0106019 A1    Apr. 2, 2020

Related U.S. Application Data

(60) Provisional application No. 62/826,126, filed on Mar. 29, 2019, provisional application No. 62/737,702, filed on Sep. 27, 2018.

(51) Int. Cl.
*H01L 51/00* (2006.01)
*H01L 51/42* (2006.01)
*H01L 51/50* (2006.01)

(52) U.S. Cl.
CPC ...... *H01L 51/0043* (2013.01); *H01L 51/0037* (2013.01); *H01L 51/0046* (2013.01); *H01L 51/422* (2013.01); *H01L 51/4253* (2013.01); *H01L 51/5056* (2013.01);

(Continued)

(58) Field of Classification Search
CPC .............. H01L 51/42–448; H01L 51/00–56
See application file for complete search history.

(56) References Cited

U.S. PATENT DOCUMENTS

| | | |
|---|---|---|
| 6,605,549 B2 | 8/2003 | Leu et al. |
| 7,902,064 B1 | 3/2011 | Chiang et al. |
| 2009/0188558 A1 | 7/2009 | Jen et al. |

(Continued)

FOREIGN PATENT DOCUMENTS

| | | |
|---|---|---|
| WO | 2014090394 A1 | 6/2014 |
| WO | 2017108710 A1 | 6/2017 |

OTHER PUBLICATIONS

Eperon, et al. "Perovskite-perovskite tandem photovoltaics with optimized band gaps." Science 354.6314 (2016): 861-865.*

(Continued)

*Primary Examiner* — William E McClain
(74) *Attorney, Agent, or Firm* — Michael A. McIntyre

(57) ABSTRACT

The present disclosure relates to a device that includes a first layer that includes at least one of a semiconducting material, a hole transport material (HTM), and/or an electron transport material (ETM), a second layer, and a third layer that includes a material that is at least one of transparent or conductive, where the second layer is positioned between the first layer and the third layer, the first layer, the second layer, and the third layer are in electrical contact with each other, and the third layer has a first thickness between greater than zero nm and about 100 nm. In some embodiments of the present disclosure, the semiconducting material may include a perovskite.

10 Claims, 30 Drawing Sheets

(52) U.S. Cl.
CPC .... *H01L 51/5072* (2013.01); *H01L 2251/303* (2013.01); *H01L 2251/558* (2013.01)

(56) References Cited

U.S. PATENT DOCUMENTS

| | | | |
|---|---|---|---|
| 2014/0060643 | A1 | 3/2014 | Martin et al. |
| 2017/0133163 | A1 | 5/2017 | Russell et al. |
| 2018/0033983 | A1 | 2/2018 | Yang et al. |
| 2018/0097182 | A1 | 4/2018 | Benzie |
| 2018/0226529 | A1 | 8/2018 | Uzu et al. |
| 2020/0148711 | A1* | 5/2020 | Leijtens ................ H01L 51/422 |

OTHER PUBLICATIONS

Li, et al. "Inorganic perovskite light emitting diodes with ZnO as the electron transport layer by direct atomic layer deposition." Organic Electronics 57 (2018): 60-67.*

Nam, et al., "Effects of the pyromellitic dianhydride cathode interfacial layer on characteristics of organic solar cells based on poly (3-hexylthiophene-2, 5-diyl) and [6, 6]-phenyl C61 butyric acid methyl ester." Journal of Materials Research 25.5 (2010): 866-870.*

Wang, et al. "Atomic layer deposition of metal oxides on pristine and functionalized graphene." Journal of the American Chemical Society 130.26 (2008): 8152-8153.*

Ha, et al. "Device architecture for efficient, low-hysteresis flexible perovskite solar cells: Replacing TiO2 with C60 assisted by polyethylenimine ethoxylated interfacial layers." Solar Energy Materials and Solar Cells 161 (2017): 338-346.*

Pisoni, et al. "Impact of interlayer application on band bending for improved electron extraction for efficient flexible perovskite mini-modules." Nano Energy 49 (2018): 300-307.*

Beal, R. et al., "Cesium Lead Halide Perovskites with Improved Stability for Tandem Solar Cells," Journal of Physical Chemistry Letters, vol. 7, 2016, pp. 746-751.

Bush, K. et al., "23.6%—efficient monolithic perovskite/silicon tandem solar cells with improved stability," Nature Energy, vol. 2, 2017, 7 pages.

Bush, K. et al., "Compositional Engineering for Efficient Wide Band Gap Perovskites with Improved Stability to Photoinduced Phase Segregation," ACS Energy Letters, vol. 3, 2018, 428-435.

Chang, C.Y. et al., "Thin-Film encapsulation of polymer-based bulk-heterojunction photovoltaic cells by atomic layer deposition," Elsevier Organic Electronics, vol. 10, 2009, pp. 1300-1306.

Chirila, A. et al., "Potassium-induced surface modification of Cu(In,Ga)Se2 thin films for high-efficiency solar cells," Nature Materials, vol. 12, 2013, 5 pages.

Christians, J. et al., "Stability in Perovskite Photovoltaics: A Paradigm for Newfangled Technologies," ACS Energy Letters, vol. 3, 2018, pp. 2136-2143.

Eperon, G. et al., "Formamidinium lead trihalide: a broadly tunable perovskite for efficient planar heterojunction solar cells," Energy & Environmental Science, vol. 7, 2014, pp. 982-988.

Feng, J. et al., "Record Efficiency Stable Flexible Perovskite Solar Cell Using Effective Additive Assistance Strategy," Advanced Materials, vol. 30, 2018, 9 pages.

Ferdousi, F. et al., "Fullerene-Based Hybrid Devices for High-Density Nonvolatile Memory," IEEE Transactions an Nanotechnology, vol. 10, No. 3, May 2011, 4 pages.

Gao, Z. et al., "Improving the stability and efficiency of perovskite light-emitting diodes via an insulating layer of polyethylenimine ethoxylated," Journal of Luminescence, vol. 201, 2018, pp. 359-363.

Ha, J. et al., "Device architecture for efficient, low-hysteresis flexible perovskite solar cells: Replacing TiO2 with C60 assisted by polyethylenimine ethoxylated interfacial layers," Solar Energy Materials & Solar Cells, 161, 2017, pp. 338-346.

Hazarika, A., "Perovskite Quantum Dot Photovoltaic Materials beyond the Reach of Thin Films: Full-Range Tuning of A-Site Cation Composition," ACS Nano, vol. 12, 2018, pp. 10327-10337.

Hüpkes, J. et al., "Chemical Etching of Zinc Oxide for Thin-Film Silicon Solar Cells," ChemPhysChem, vol. 13, 2012, pp. 66-73.

Ke, W. et al., Efficient Lead-Free Solar Cells Based on Hollow {en} MASnI3 Perovskites, Journal of the American Chemical Society, vol. 139, 2017, pp. 14800-14806.

King, D.L. et al., "New Methods For Measuring Performance of Monolithic Multi-Junction Solar Cells," Conference Record of the 28th IEEE PVSC, 2000, 5 pages.

Leijtens, T. et al., "Tin-lead halide perovskites with improved thermal and air stability for efficient all-perovskite tandem solar cells," Sustainable Energy & Fuels, vol. 2, 2018, pp. 2450-2459.

Li, Z. et al., "Stabilizing Perovskite Structures by Tuning Tolerance Factor: Formation of Formamidinium and Cesium Lead Iodide Solid-State Alloys," Chemistry of Materials, vol. 28, 2016, pp. 284-292.

Mitzi, David B., "Synthesis, Structure, and Properties of Organic-Inorganic Perovskites and Related Materials," Progress in Inorganic Chemistry, vol. 48, Edited by Kenneth D. Karlin, 1999, 121 pages.

Parsons, G. et al., "Mechanisms and reactions during atomic layer deposition on polymers," Coordination Chemistry Reviews, vol. 257, 2013, pp. 3323-3331.

Pang, S. et al., "Efficient bifacial semitransparent perovskite solar cells with silver thin film electrode," Solar Energy Materials and Solar Cells, vol. 170, 2017, 278-286.

Peng, L. et al., "Reduce the hysteresis effect with the PEIE interface dipole effect in the organic-inorganic hybrid perovskite CH3NH3PbI3-xClx solar cell," Organic Electronics, 2018, 7 pages (https://doi.org/10.1016/j.orgel.2018.06.043).

Prasanna, R. et al., "Band Gap Tuning via Lattice Contraction and Octahedral Tilting in Perovskite Materials for Photovoltaics," Journal of American Chemical Society, vol. 139, 2017, pp. 11117-11124.

Reese, M. et al., "Quantitative calcium resistivity based method for accurate and scalable water vapor transmission rate measurement," Review of Scientific Instruments, vol. 82, 2011, 10 pages.

Saparov, B. et al., "Organic-Inorganic Perovskites: Structural Versatility for Functional Materials Design," Chemical Reviews, vol. 116, 2016, pp. 4558-4596.

Seo, S. et al., Perovskite Solar Cells with Inorganic Electron- and Hole-Transport Layers Exhibiting Long-Term (**500 h) Stability at 85 ° C. under Continuous 1 Sun Illumination in Ambient Air).

Stoddard, R. et al., "Enhancing Defect Tolerance and Phase Stability of High-Bandgap Perovskites via Guanidinium Alloying," ACS Energy Letters, vol. 3, 2018, pp. 1261-1268.

Swarnkar, A. et al., "Quantum dot-induced phase stabilization of α-CsPbI3 perovskite for high-efficiency photovoltaics," Science, vol. 354, Issue 6308, 2016, 5 pages.

Xiong, J. et al., "Improved efficiency and short-term stability of the planar heterojunction perovskite solar cells with a polyelectrolyte layer," Phys. Status Solidi A, vol. 214, No. 10, 2017, 8 pages.

Yang, H. et al., "Effect of polyelectrolyte interlayer on efficiency and stability of p-i-n perovskite solar cells," Solar Energy, vol. 139, 2016, pp. 190-198.

Yoo, J.S et al., "Dual function of a high-contrast hydrophobic-hydrophilic coating for enhanced stability of perovskite solar cells in extremely humid environments," Nano Research, vol. 10, No. 11, 2017, pp. 3885-3895.

Zhou, Y. et al., "High performance polymeric charge recombination layer for organic tandem solar cells," Energy & Environmental Science, vol. 5, 2012, pp. 9827-9832.

Zhou, Y. et al., "A Universal Method to Produce Low-Work Function Electrodes for Organic Electronics," Science, vol. 336, 2012, 7 pages.

PCT International Search Report (4 pages) and Written Opinion (6 pages) from corresponding PCT/US19/53499 dated May 5, 2020, 10 pages total.

Zhou, H. et al., "Interface Engineering of Highly Efficient Perovskite Solar Cells," Science, vol. 345, Issue 6196, 2014, 6 pages.

Supplementary Partial European Search Report from corresponding European Patent Application No. 19869533.0, dated May 19, 2022, 14 pages.

* cited by examiner

OPTOELECTRONIC DEVICES AND METHODS OF MAKING THE SAME

CROSS-REFERENCE TO RELATED APPLICATIONS

This application claims the benefit of U.S. Provisional Patent Application Nos. 62/737,702 and 62/826,126 filed Sep. 27, 2018, and Mar. 29, 2019, respectively, the contents of which are incorporated herein by reference in their entirety.

CONTRACTUAL ORIGIN

The United States Government has rights in this disclosure under Contract No. DE-AC36-08GO28308 between the United States Department of Energy and Alliance for Sustainable Energy, LLC, the Manager and Operator of the National Renewable Energy Laboratory.

SUMMARY

An aspect of the present disclosure is a device that includes a first layer that includes at least one of a semiconducting material, a hole transport material (HTM), and/or an electron transport material (ETM), a second layer, and a third layer that includes a material that is at least one of transparent or conductive, where the second layer is positioned between the first layer and the third layer, the first layer, the second layer, and the third layer are in electrical contact with each other, and the third layer has a first thickness between greater than zero nm and about 100 nm. In some embodiments of the present disclosure, the semiconducting material may include a perovskite.

In some embodiments of the present disclosure, the HTM may include at least one of PEDOT:PSS and/or an oxide. In some embodiments of the present disclosure, the ETM may include at least one of a structured carbon, an oxide, LiF, calcium carbonate, and/or an organic molecule. In some embodiments of the present disclosure, the material of the third layer may include at least one of indium, tin, aluminum, cadmium, zinc, gallium, fluorine, silver, gold, molybdenum, bismuth, nickel, chromium, antimony, and/or copper. In some embodiments of the present disclosure, the material of the third layer may be an oxide.

In some embodiments of the present disclosure, second layer may include a functional group that includes at least one of a hydroxyl group and/or an amine. In some embodiments of the present disclosure, the second layer may include at least one of an alkane, an alkene, an alkyne, an aromatic, a hydroxyl, a carbonyl, an ether, and ester, an oxide, thiol, an amine, a phosphate, a sulphate, an imine, a carboxylic acid, a sulfuric acid, an amide, an ester, an acyl phosphate, a nitrile, a halide, an ether, a ketone, a sulfide, an acid halide, an acid anhydride, an epoxide, and/or a nitro functional group. In some embodiments of the present disclosure, the second layer may include at least one of poly(ethylenimine) ethoxylated (PEIE) and/or an acid anhydride. In some embodiments of the present disclosure, the second layer may have a second thickness between greater than zero nanometers and about 10 nanometers.

In some embodiments of the present disclosure, the device may further include a fourth layer that includes at least one of a second semiconducting material, a second HTM, or a second ETM, where the third layer is positioned between the second layer and the fourth layer, the first layer, the second layer, the third layer, and the fourth layer are electrically connected. In some embodiments of the present disclosure, the third layer may have an electrical sheet resistance laterally across the plane of the third layer between 1 KOhm/sq and 10 MOhm/sq.

In some embodiments of the present disclosure, the second layer may result in the device having at least one improved physical property or performance metric. In some embodiments of the present disclosure, the improved physical property or performance metric may include improved bonding of the third layer to the second layer as demonstrated by a shift in at least one of an oxygen peak, a metal peak, or a carbon peak, as detected by X-ray photoelectron spectroscopy. In some embodiments of the present disclosure, the improved physical property or performance metric may include improved bonding of the third layer to the second layer as demonstrated by emersion of the device in pure dimethylformamide for about 30 seconds at about room temperature.

In some embodiments of the present disclosure, the first layer may be a fullerene, the second layer may include at least one poly(ethylenimine) ethoxylated (PEIE) and/or an acid anhydride, and the material of the third layer may include a metal oxide. In some embodiments of the present disclosure, the device may further include a fourth layer that includes a perovskite, where the first layer is positioned between the second layer and the fourth layer.

An aspect of the present disclosure is a method that includes exposing a first layer to at least one of ozone or ultraviolet light and a first depositing of a second layer onto the first layer, where the second layer includes a metal oxide, and the second layer has a thickness between greater than zero nm and 500 nm. In some embodiments of the present disclosure, the first depositing may include a vapor phase method.

An aspect of the present disclosure is a device that includes a first layer that includes a perovskite, a second layer that includes a first metal oxide, and a third layer that includes a second metal oxide, where the second layer is between the first layer and the third layer, the first layer, the second layer, and the third layer are in electrical contact with each other, the second layer has a first thickness between greater than zero nm and 50 nm, and the third layer has a second thickness between greater than zero nm and 100 nm.

BRIEF DESCRIPTION OF THE DRAWINGS

Some embodiments are illustrated in referenced figures of the drawings. It is intended that the embodiments and figures disclosed herein are to be considered illustrative rather than limiting.

REFERENCE NUMBERS

Figure 1A:
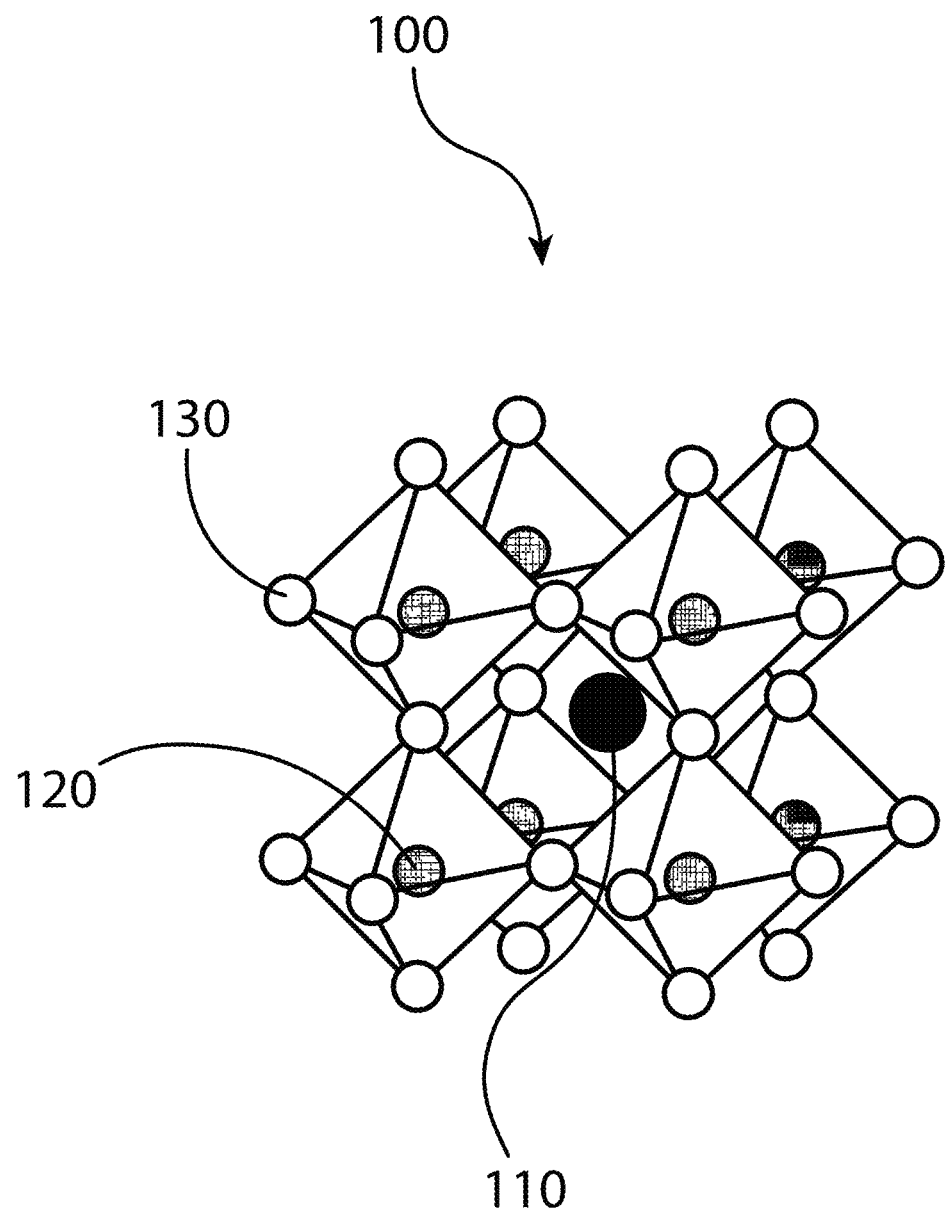
FIGS. 1A, 1B, and 1C illustrate a perovskite, according to some embodiments of the present disclosure.

100 . . . perovskite
110 . . . A-cation

120 . . . B-cation
130 . . . X-anion
200 . . . device
210 . . . substrate
220 . . . contact layer
230 . . . charge transport layer
240 . . . active layer
250 . . . intervening layer
260 . . . interconnect layer
300 . . . device
310 . . . barrier layer

DETAILED DESCRIPTION

The present disclosure may address one or more of the problems and deficiencies of the prior art discussed above. However, it is contemplated that some embodiments as disclosed herein may prove useful in addressing other problems and deficiencies in a number of technical areas. Therefore, the embodiments described herein should not necessarily be construed as limited to addressing any of the particular problems or deficiencies discussed herein.

References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein the term "substantially" is used to indicate that exact values are not necessarily attainable. By way of example, one of ordinary skill in the art will understand that in some chemical reactions 100% conversion of a reactant is possible, yet unlikely. Most of a reactant may be converted to a product and conversion of the reactant may asymptotically approach 100% conversion. So, although from a practical perspective 100% of the reactant is converted, from a technical perspective, a small and sometimes difficult to define amount remains. For this example of a chemical reactant, that amount may be relatively easily defined by the detection limits of the instrument used to test for it. However, in many cases, this amount may not be easily defined, hence the use of the term "substantially". In some embodiments of the present invention, the term "substantially" is defined as approaching a specific numeric value or target to within 20%, 15%, 10%, 5%, or within 1% of the value or target. In further embodiments of the present invention, the term "substantially" is defined as approaching a specific numeric value or target to within 1%, 0.9%, 0.8%, 0.7%, 0.6%, 0.5%, 0.4%, 0.3%, 0.2%, or 0.1% of the value or target.

As used herein, the term "about" is used to indicate that exact values are not necessarily attainable. Therefore, the term "about" is used to indicate this uncertainty limit. In some embodiments of the present invention, the term "about" is used to indicate an uncertainty limit of less than or equal to ±20%, ±15%, ±10%, ±5%, or ±1% of a specific numeric value or target. In some embodiments of the present invention, the term "about" is used to indicate an uncertainty limit of less than or equal to ±1%, ±0.9%, ±0.8%, ±0.7%, ±0.6%, ±0.5%, ±0.4%, ±0.3%, ±0.2%, or ±0.1% of a specific numeric value or target.

The present disclosure relates to optoelectronic devices (e.g. photovoltaic cells, perovskite-containing solar cells) that include layers that provide, among other things, surfaces upon which oxide layers, sulfide layers, and/or other inorganic layers may be nucleated, resulting in more conformal final oxide layers that provide both physical barriers to the environment (e.g. atmospheric moisture and/or oxygen), physical barriers to downstream processing steps (e.g. exposure to solvents from solution processing steps), and/or physical barriers to diffusion of species (e.g. halogens, metals) between layers on either side of the barriers, thus insuring long-term stability and quality of the underlying layers (e.g. perovskite layers) and the device as a whole. In some embodiments of the present disclosure, such barrier layers may enable the manufacture of perovskite-containing devices having more than one perovskite active layer stacked upon one another; e.g. tandem (two active layer) devices. Using the methods and layers described herein, processing methods (e.g. solution and/or vapor processing methods) may be employed to produce two or more stacked perovskite active layers, due to the barrier properties of an intervening layer, which effectively isolates the first-produced perovskite active layer from the components (e.g. solvents for the case of solution processing) used in the processing step to deposit the second perovskite active layer onto the first perovskite layer.

Figure 1B:
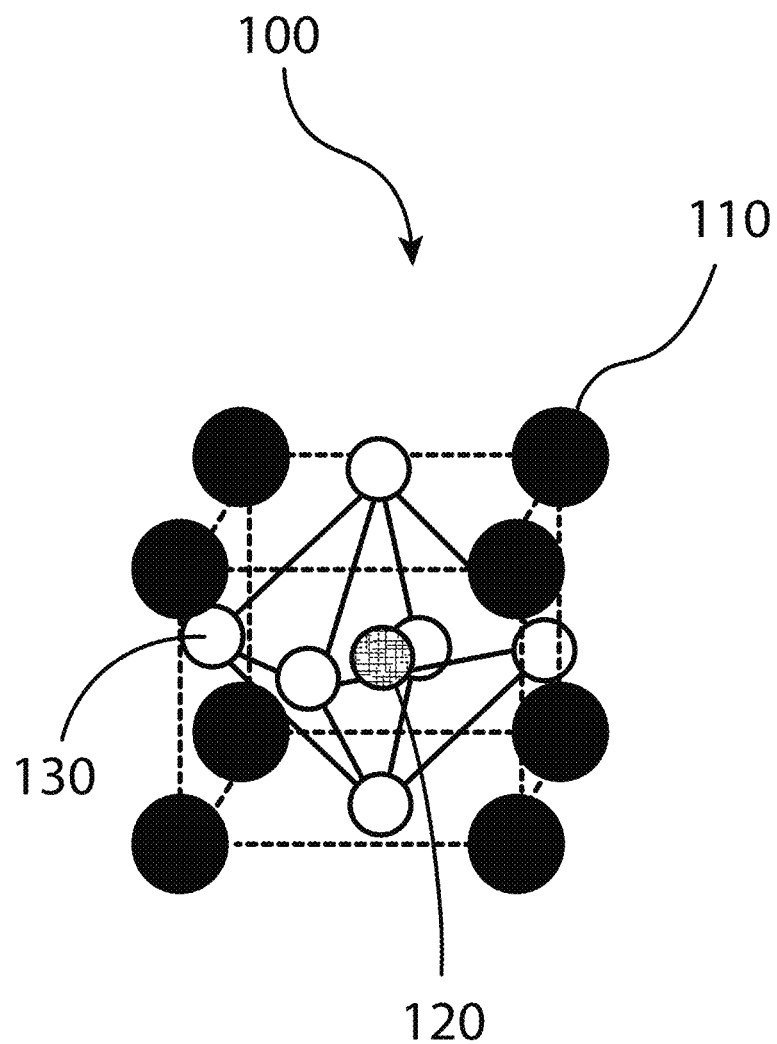
Figure 1C:
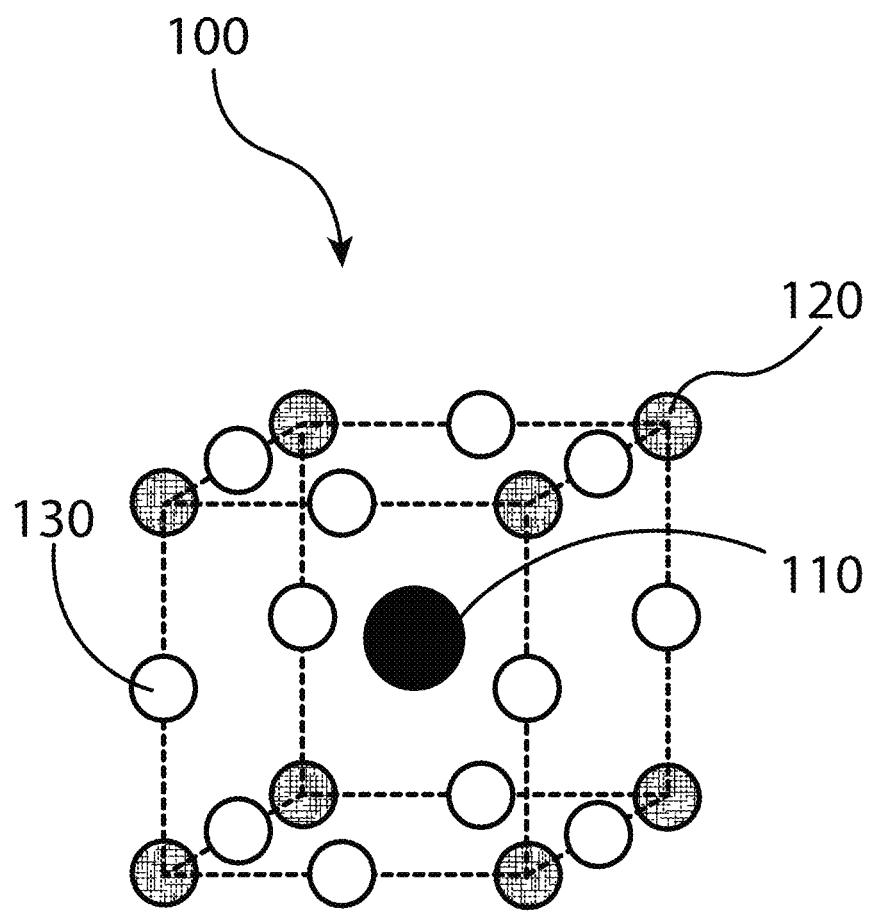

FIGS. 1A, 1B, and 1C illustrate that perovskites 100, for example halide perovskites, may organize into cubic crystalline structures with corner-sharing octahedra, as well as other crystalline structures such as tetragonal, hexagonal, and orthorhombic with either edge- or face-sharing octahedra, and may be described by the general formula $ABX_3$, where X (130) is an anion and A (110) and B (120) are cations, typically of different sizes. In some embodiments of the present disclosure, a perovskite may have a layered structure that includes 3D structures described above positioned between sheets of organic cations; these are often termed 2D perovskites. Mixture of the 2D and 3D phases are also possible. FIG. 1A illustrates that a perovskite 100 may be organized into eight octahedra surrounding a central A-cation 110, where each octahedra is formed by six X-anions 130 surrounding a central B-cation 120. FIG. 1B illustrates that a perovskite 100 may be visualized as a cubic unit cell, where the B-cation 120 is positioned at the center of the cube, an A-cation 110 is positioned at each corner of the cube, and an X-anion 130 is face-centered on each face of the cube. FIG. 1C illustrates that a perovskite 100 may also be visualized as a cubic unit cell, where the B-cation 120 resides at the eight corners of a cube, while the A-cation 110 is located at the center of the cube and with 12 X-anions 130 centrally located between B-cations 120 along each edge of the unit cell. For both unit cells illustrated in FIGS. 1B and 1C, the A-cations 110, the B-cations 120, and the X-anions 130 balance to the general formula $ABX_3$, after accounting for the fractions of each atom shared with neighboring unit cells. For example, referring to FIG. 1B, the single B-cation 120 atom is not shared with any of the neighboring unit cells. However, each of the six X-anions 130 is shared between two unit cells, and each of the eight A-cations 110 is shared between eight unit cells. So, for the unit cell shown in FIG. 1B, the stoichiometry simplifies to B=1, A=8*0.125=1, and X=6*0.5=3, or $ABX_3$. Similarly, referring again to FIG. 1C, since the A-cation is centrally positioned, it is not shared with any of the unit cells neighbors. However, each of the 12 X-anions 130 is shared between four neighboring unit cells, and each of the eight B-cations 120 is shared between eight neighboring unit cells, resulting in A=1, B=8*0.125=1, and X=12*0.25=3, or ABX$_3$. Referring again to FIG. 1C, the X-anions 130 and the B-cations 120 are shown as aligned along an axis; e.g. where the angle at the X-anion 130 between two neighboring B-cations 120 is exactly 180 degrees, referred to herein as the tilt angle. However, a perovskite 100 may have a tilt angle not equal to 180 degrees. For example, some embodiments of the present disclosure may have a tilt angle between 153 and 180 degrees.

Typical inorganic perovskites include calcium titanium oxide (calcium titanate) minerals such as, for example, CaTiO$_3$ and SrTiO$_3$. In some embodiments of the present invention, the A-cation 110 may include a nitrogen-containing organic compound such as an alkyl ammonium compound. The B-cation 120 may include a metal and the X-anion 130 may include a halogen. Additional examples for the A-cation 110 include organic cations and/or inorganic cations, for example Cs, Rb, K, Na, Li, and/or Fr. Organic A-cations 110 may be an alkyl ammonium cation, for example a $C_{1-20}$ alkyl ammonium cation, a $C_{1-6}$ alkyl ammonium cation, a $C_{2-6}$ alkyl ammonium cation, a $C_{1-5}$ alkyl ammonium cation, a $C_{1-4}$ alkyl ammonium cation, a $C_{1-3}$ alkyl ammonium cation, a $C_{1-2}$ alkyl ammonium cation, and/or a $C_1$ alkyl ammonium cation. Further examples of organic A-cations 110 include methylammonium (CH$_3$NH$_3{}^+$), ethylammonium (CH$_3$CH$_2$NH$_3{}^+$), propylammonium (CH$_3$CH$_2$ CH$_2$NH$_3{}^+$), butylammonium (CH$_3$CH$_2$CH$_2$ CH$_2$NH$_3{}^+$), formamidinium (NH$_2$CH=NH$_2{}^+$), hydrazinium, acetyl ammonium, dimethylammonium, imidazolium, guanidinium, benzylammonium, phenethylammonium, butylammonium and/or any other suitable nitrogen-containing or organic compound. In other examples, an A-cation 110 may include an alkylamine. Thus, an A-cation 110 may include an organic component with one or more amine groups. For example, an A-cation 110 may be an alkyl diamine halide such as formamidinium (CH(NH$_2$)$_2$). Thus, the A-cation 110 may include an organic constituent in combination with a nitrogen constituent. In some cases, the organic constituent may be an alkyl group such as straight-chain or branched saturated hydrocarbon group having from 1 to 20 carbon atoms. In some embodiments, an alkyl group may have from 1 to 6 carbon atoms. Examples of alkyl groups include methyl (C$_1$), ethyl (C$_2$), n-propyl (C$_3$), iso-propyl (C$_3$), n-butyl (C$_4$), tert-butyl (C$_4$), sec-butyl (C$_4$), iso-butyl (C$_4$), n-pentyl (C$_5$), 3-pentanyl (C$_5$), amyl (C$_5$), neopentyl (C$_5$), 3-methyl-2-butanyl (C$_5$), tertiary amyl (C$_5$), and n-hexyl (C$_6$). Additional examples of alkyl groups include n-heptyl (C$_7$), n-octyl (C$_8$) and the like.

Examples of metal B-cations 120 include, for example, lead, tin, germanium, and or any other 2+ valence state metal that can charge-balance the perovskite 100. Further examples include transition metals in the 2+ state such as Mn, Mg, Zn, Cd, and/or lanthanides such as Eu. B-cations may also include elements in the 3+ valence state, as described below, including for example, Bi, La, and/or Y. Examples for X-anions 130 include halogens: e.g. fluorine, chlorine, bromine, iodine and/or astatine. In some cases, the perovskite halide may include more than one X-anion 130, for example pairs of halogens; chlorine and iodine, bromine and iodine, and/or any other suitable pairing of halogens. In other cases, the perovskite 100 may include two or more halogens of fluorine, chlorine, bromine, iodine, and/or astatine.

Thus, the A-cation 110, the B-cation 120, and X-anion 130 may be selected within the general formula of ABX$_3$ to produce a wide variety of perovskites 100, including, for example, methylammonium lead triiodide (CH$_3$NH$_3$PbI$_3$), and mixed halide perovskites such as CH$_3$NH$_3$PbI$_{3-x}$Cl$_x$ and CH$_3$NH$_3$PbI$_{3-x}$Br$_x$. Thus, a perovskite 100 may have more than one halogen element, where the various halogen elements are present in non-integer quantities; e.g. x is not equal to 1, 2, or 3. In addition, perovskite halides, like other organic-inorganic perovskites, can form three-dimensional (3-D), two-dimensional (2-D), one-dimensional (1-D) or zero-dimensional (0-D) networks, possessing the same unit structure. As described herein, the A-cation 110 of a perovskite 100, may include one or more A-cations, for example, one or more of cesium, FA, MA, etc. Similarly, the B-cation 120 of a perovskite 100, may include one or more B-cations, for example, one or more of lead, tin, germanium, etc. Similarly, the X-anion 130 of a perovskite 100 may include one or more anions, for example, one or more halogens (e.g. at least one of I, Br, Cl, and/or F), thiocyanate, and/or sulfur. Any combination is possible provided that the charges balance.

For example, a perovskite having the basic crystal structure illustrated in FIGS. 1A-1C, in at least one of a cubic, orthorhombic, and/or tetragonal structure, may have other compositions resulting from the combination of the cations having various valence states in addition to the 2+ state and/or 1+ state described above for lead and alkyl ammonium cations; e.g. compositions other than AB$^{2+}$X$_3$ (where A is one or more cations, or for a mixed perovskite where A is two or more cations). Thus, the methods described herein may be utilized to create novel mixed cation materials having the composition of a double perovskite (elpasolites), A$_2$B$^{1+}$B$^{3+}$X$_6$, with an example of such a composition being Cs$_2$BiAgCl$_6$ and Cs$_2$CuBiI$_6$. Another example of a composition covered within the scope of the present disclosure is described by A$_2$B$^{4+}$X$_6$, for example Cs$_2$PbI$_6$ and Cs$_2$SnI$_6$. Yet another example is described by A$_3$B$_2{}^{3+}$X$_9$, for example Cs$_3$Sb$_2$I$_9$. For each of these examples, A is one or more cations, or for a mixed perovskite, A is two or more cations.

Figure 2:
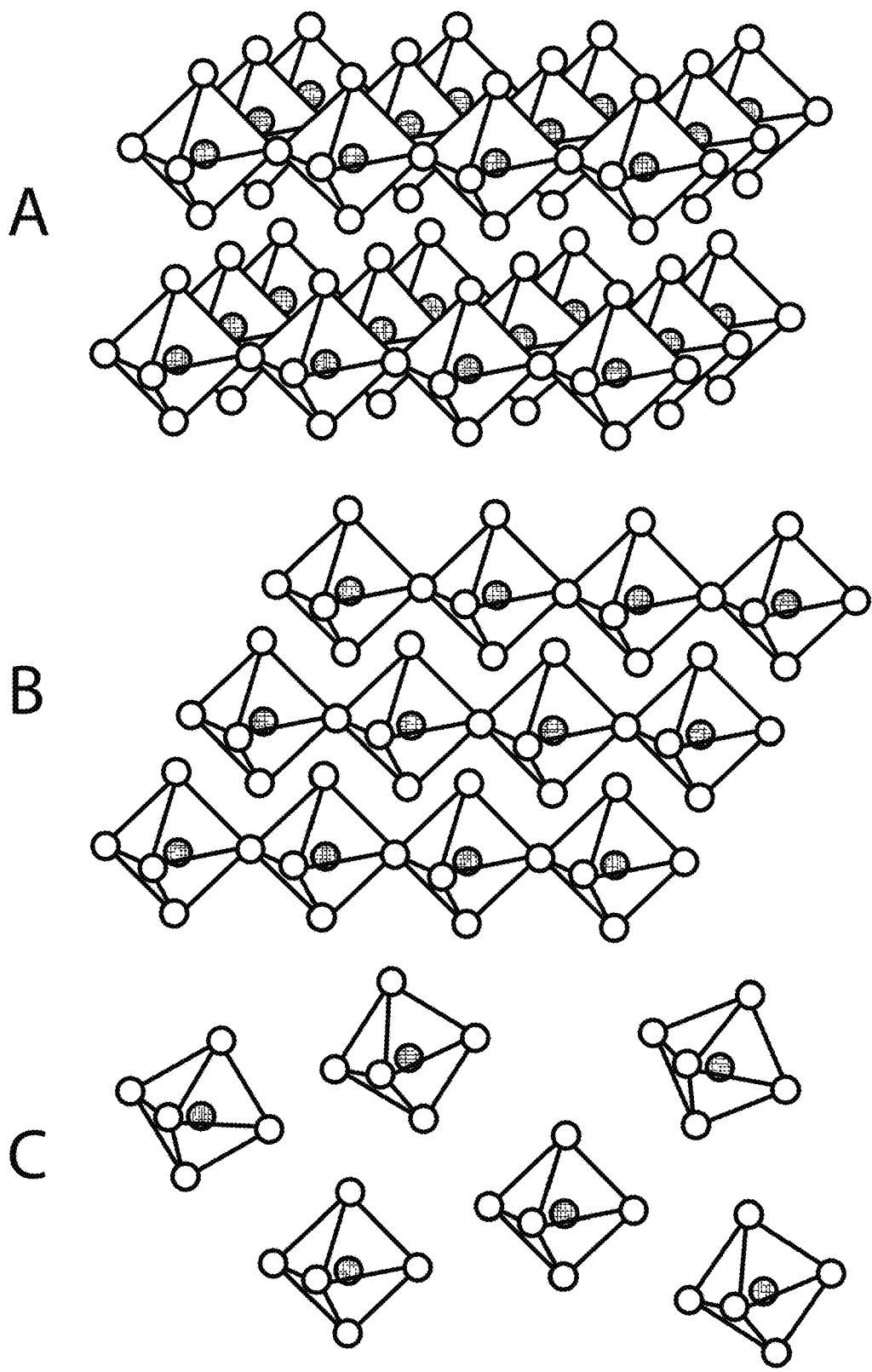
FIG. 2 illustrates 2D, 1D, and 0D perovskite structures, in Panels A, B, and C, respectively, according to some embodiments of the present disclosure.

In addition, perovskite halides, like other organic-inorganic perovskites, can form a three-dimensional (3D) network, a two-dimensional (2D) network, a one-dimensional (1D) network and/or a zero-dimensional (0D) network, possessing the same unit structure. A perovskite's 3D network is illustrated in FIGS. 1A, 1B, and 1C. FIG. 2 illustrates a 2D perovskite network, a 1D perovskite network, and a 0D perovskite network, in Panels A, B, and C, respectively. As described above, a 3D perovskite may adopt a general chemical formula of ABX$_3$, in which the A-cation may be a monovalent cation (e.g. methylammonium and/or formamidinium CH(NH$_2$)$_2{}^+$), the B-cation may be a divalent cation (e.g. Pb$^{2+}$ and/or Sn$^{2+}$), and the X-anion may be a halide anion (I$^-$, Br$^-$, and/or Cl$^-$). In this formula, the 3D network of perovskites may be constructed by linking all corner sharing BX$_6$ octahedra, with the A-cation filling the space between eight octahedral unit cells to balance the crystal charge.

Referring to Panel A of FIG. 2, through the chemically accomplished dimensional reduction of the 3D crystal lattice, 2D perovskites, (A')$_m$(A)$_{n-1}$BnX$_{3n+1}$, may adopt a new structural and compositional dimension, A' (not shown), where monovalent (m=2) or divalent (m=1) cations can intercalate between the X-anions of the 2D perovskite sheets. Referring to Panel B of FIG. 2, 1D perovskites are constructed by BX$_6$ octahedral chained segments spatially isolated from each other by surrounding bulky organic cations (not shown), leading to bulk assemblies of paralleled octahedral chains. Referring to Panel C of FIG. 2, typically, the 0D perovskites are consisted of isolated inorganic octahedral clusters and surrounded by small cations (not shown) which are connected via hydrogen bonding.

Figure 3:
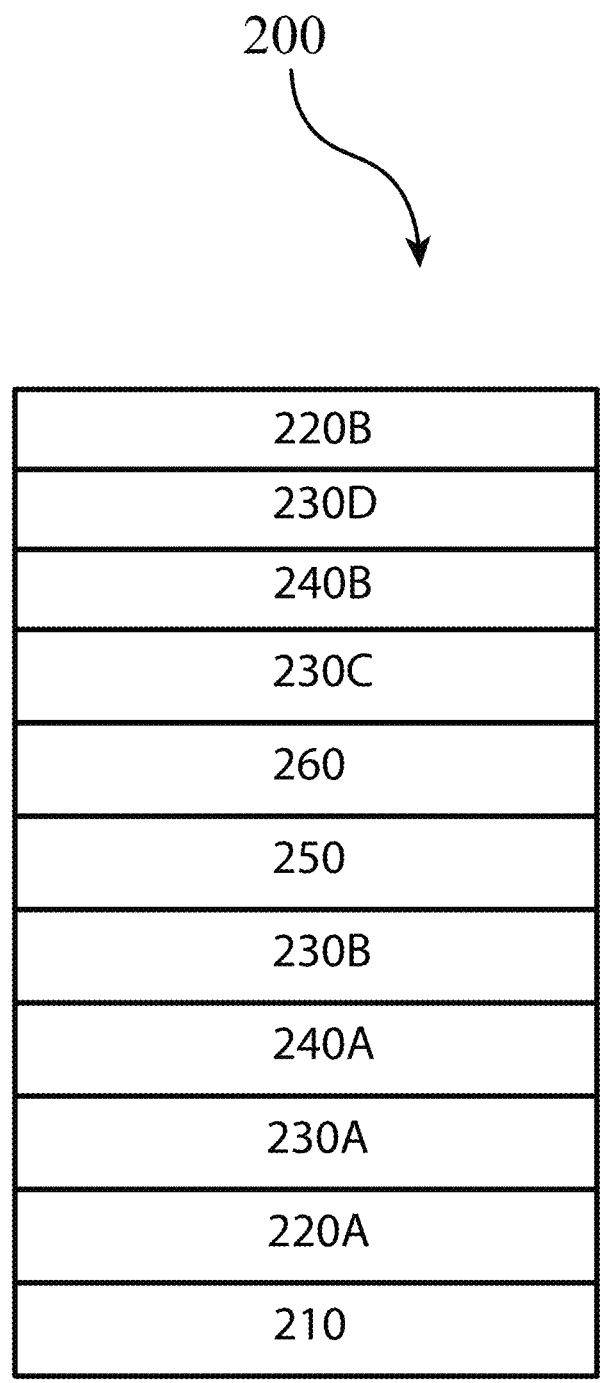
FIG. 3 illustrates a generalized schematic of an optoelectronic device (e.g. perovskite-containing device), according to some embodiments of the present disclosure.

FIG. 3 illustrates a tandem optoelectronic device 200 that includes among other elements, an intervening layer 250 positioned between a first active layer 240A, for example a "wide" bandgap perovskite-containing layer, and an interconnect layer 260, where a wide bandgap refers to a bandgap between about 1.4 eV and about 2.3 eV, or between about 1.55 eV and about 1.75 eV. The first active layer 240A may include at least one of the perovskites described above and illustrated in FIGS. 1A-1C and/or other photovoltaic materials. The tandem device 200 of FIG. 3 includes the first active layer 240A and a second active layer 240B, where the second active layer 240B may also include a perovskite as described above, for example a "low" bandgap perovskite or other (including, for example, silicon, copper indium gallium selenide (CIGS)) material, cadmium tellurium (CdTe), organic materials, and/or any other material and/or alloy having semiconducting and/or photovoltaic properties). As used herein, a low bandgap refers to a bandgap between about 0.9 eV and about 1.4 eV, or between about 1.2 eV and about 1.3 eV. The first active layer 240A and the second active layer 240B may be "voltage stacked" by electrically connecting the two active layers using the interconnect layer 260 positioned between the first active layer 240A and the second active layer 240B. As described herein, a high quality, conformal interconnect layer 260 having appropriate lateral resistance to charge transfer to minimize charge shunting through defects in the neighboring layers (e.g. pin-holes, cracks, etc.), that is also sufficiently thin to minimize out-of-plane resistance, and that also provides a physical barrier between the two, is enabled through the use of the intervening layer 250. In some embodiments of the present disclosure, an interconnect layer 260, as positioned in FIG. 3, may serve as both an interconnect and a barrier layer (e.g. to a solvent).

In some embodiments of the present disclosure, the intervening layer 250 may be constructed of a material having functional groups that provide sites with which the subsequently deposited layer (referring to the example of FIG. 3, the interconnect layer 260) can interact to provide a better-quality deposited layer (e.g. a more conformal layer, improved crystal structure, reduced layer thickness, reduced surface variations, etc.). The interaction between the intervening layer 250 and the subsequently deposited layer may depend upon the method employed to deposit the subsequent layer. For example, vapor phase methods (e.g. chemical vapor deposition (CVD), atomic layer deposition (ALD), metal organic chemical vapor deposition (MOCVD), thermal evaporation, pulsed laser deposition (PLD), vapor transport deposition (VTD), sputter deposition, and/or molecular layer deposition (MLD)) for depositing the subsequent layer (e.g. the interconnect layer 260) may utilize reactants, precursors, additives, carrier gases, etc. that have different functional groups and/or physical properties than those used in solution processing methods. Thus, the functional groups provided by an intervening layer 250 may be tuned to obtain the best results attainable for the specific subsequently deposited layer (e.g. the interconnect layer 260) needed to attain a specific total device architecture. In some embodiments of the present disclosure, the intervening layer 250 may be capable of conducting charge carriers (electrons or holes) by some means, such as at least one of band transport, hopping, and/or tunneling.

In some embodiments of the present disclosure, an intervening layer 250 may include an organic and/or inorganic compound having a functional group including at least one of an alkane, an alkene, an alkyne, an aromatic, a hydroxyl, a carbonyl, an ether, an ester, an oxide, a thiol, an amine, a phosphate, a sulphate, a sulfoxide, a sulfonate, an imine, a carboxylic acid, a sulfuric acid, an amide, an ester, an acyl phosphate, a nitrile, a halide, an ether, a ketone, a sulfide, an acid halide, an acid anhydride, an epoxide, and/or a nitro functional group. In some embodiments of the present disclosure, an intervening layer 250 may include a polymer having a functional group that includes at least one of an epoxide, a hydroxyl group and/or an amine group, for example poly(ethylenimine) ethoxylated (PEIE), as shown in Structure 1 below,

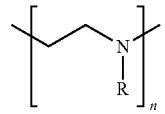

Structure 1 where R includes —$CH_2CH_2NR'_2$, —H, and —$CH_2CH_2OH$ and R' is a least one of a hydrocarbon, oxygen, nitrogen, sulfur, and/or a halogen, and n is between 1 and 100,000. Examples of an inorganic material that can act as intervening layer include PbO, SnO, and/or other oxides. In some embodiments of the present disclosure, the intervening layer may include terminating halogen groups (I, Cl, Br, F) that will halogen-bond and/or react with the subsequent layer precursors to form a dense second layer, for example a dense interconnect layer. Inorganic examples for constructing intervening layers include metal halides in any oxidation state such as $SnI_2$, $SnF_2$, $SnBr_2$, $SnCl_2$, $SnI_4$, $SnBr_4$, $SnCl_4$, $SnF_4$, a zinc halide, a titanium halide, and/or a lead halide, etc. Halogen terminated organic small molecules and/or polymers are other examples where halogen bonding to precursors will enhance nucleation of the layer subsequently deposited on the intervening layer.

Another class of materials that may be used to form an intervening layer includes self-assembled monolayers (SAMs), including silanes and phosphonic acids of the general formula $Si(OR^1)_3R^2$ or $SiX_3R^2$ and $PO_3H_2R^2$, respectively, where R groups represent alkyl groups where one or more of which can contain various functionalization such as amine, amide, carboxylic acid, sulfide, etc. groups. These can be placed directly on a perovskite material and/or on the subsequent layer and the SAM materials may exist as independent units or crosslink as a thin film.

Another class of materials that may be used to form an intervening layer include functionalized materials that can occupy the A-site in the perovskite lattice (e.g. 2D perovskite additives), including choline chloride, amino acids, glycine, 5-aminovaleric acid, methylviologen, tyramine, or an amine-containing compound with at least one additional functional group that may be an alkane, an alkene, an alkyne, an aromatic, a hydroxyl, a thiol, an amine, a phosphate, an imine, a carboxylic acid, an amide, an ester, an acyl phosphate, a nitrile, a halide, an ether, a ketone, a sulfide, an acid halide, an acid anhydride, an epoxide, and/or a nitro functional group.

Another class of materials that may be used to form an intervening layer are small molecules with at least one functional group that may be an alkane, an alkene, an alkyne, an aromatic, a hydroxyl, a thiol, an amine, a phosphate, an imine, a carboxylic acid, an amide, an ester, an acyl phosphate, a nitrile, a halide, an ether, a ketone, a sulfide, an acid halide, an acid anhydride, an epoxide, and/or a nitro functional group. These small molecules could be functionalized carbon compounds, such as fullerenols, fullerenes functionalized with other groups (e.g. an epoxide), or hydroxylated carbon nanotubes. Structure 2 shows a more general chemical structure for chemical compounds that may be used to construct in an intervening layer 250, according to some embodiments of the present disclosure, Structure 2

where R may be any organic and/or inorganic component, including for example, saturated and/or unsaturated, branched and/or unbranched hydrocarbon chains and/or aromatic compounds. In some embodiments of the present disclosure, an intervening layer may be placed directly on a perovskite layer 240A or 240B and/or on top of a charge transport layer 230 (which can itself be comprised of multiple functional layers and materials) as a protective layer and/or recombination layer.

Referring again to FIG. 3, the exemplary device 200 shown includes charge transport layers (CTLs) 230 for each of the active layers (240A and 240B). Thus, the first active layer 240A may be positioned between a first CTL 230A, in this example a hole transport layer (HTL), and a second CTL 230B, in this example an electron transport layer (ETL). Similarly, the second active layer 240B is positioned between a third CTL 230C, in this example a HTL, and a fourth CTL 230B, in this example an ETL. Thus, in some embodiments of the present disclosure, the intervening layer 250 may be positioned between a CTL 230 and an interconnect layer 260. Finally, the example device 200 of FIG. 3 may also include a first contact layer 220A and a second contact layer 220B, where all of the other elements described above for FIG. 3 (the CTLs 230, active layers 240, interconnect layer 260, and intervening layer 250) are positioned between the first contact layer 220A and the second contact layer 220B. In addition, all of the elements described above may be positioned on a substrate 210 that, among other things, may provide a starting surface upon which to grow all of the subsequent layers. Thus, according to some embodiments of the present disclosure, a device 200 may apply in order, a first contact layer 220A onto a substrate 210, a first CTL 230A onto the first contact layer 220A, a first active layer 240A onto the first CTL 230A, a second CTL 230B onto the first active layer 240A, an intervening layer 250 onto the second CTL 230B, an interconnect layer 260 onto the intervening layer 250, a third CTL 230C onto the interconnect layer 260, a second active layer 240B onto the third CTL 230C, a fourth CTL 230D onto the second active layer 240B, and a second contact layer 220B onto the fourth CTL 230D. Thus, according to some embodiments of the present disclosure, any of the layers 220 and 230 may also be removed to provide alternate structures.

A substrate 210 may be constructed of a material that includes at least one of glass, an oxide, a metal, and/or a polymer. In some embodiments of the present disclosure, the substrate 210 may be substantially transparent to light having a wavelength between about 300 nm and about 1200 nm. A contact layer 220 may be constructed of a material that includes at least one of a conducting oxide (transparent or opaque), for example indium tin oxide (ITO), aluminum doped zinc oxide, hydrogenated indium oxide, cadmium stannate, indium zinc oxide, zinc tin oxide, indium gallium zinc oxide, and/or fluorine-doped tin oxide (FTO), and/or a metal, for example a silver, gold, aluminum, molybdenum, bismuth, nickel, chromium, and/or copper as a thin film or foil.

A HTL (e.g. CTLs 230A and 230C) may be constructed of a material that includes at least one of an organic material and/or inorganic material. Examples of suitable organic hole transport materials (HTMs) for constructing HTLs include various polymers such as poly(bis(4-phenyl)(2,4,6-triphenyl)amine (PTAA), 2,2',7,70-tetrakis-(N,N-di-4-methoxyphenylamino)-9,9-spirobifluorene (Spiro-OmeTAD), poly (3,4-ethylene dioxythiophene) polystyrene sulfonate polymer (PEDOT:PSS), Poly (3-hexylthiophene) (P3HT), Poly (3-hexylthiophene) (P3HT), poly tri-arylamine (PTAA), poly(N,N'-bis-4-butylphenyl-N,N'-bisphenyl)benzidine, and/or poly[(9,9-bis(3'-(N,N-dimethylamino)propyl)-2,7-fluorene)-alt-2,7-(9,9-dioctylfluorene). Other suitable organic HTMs may include smaller molecules that include at least one of a pyrene, thiophene, porphyrin, and/or carbazole; e.g. 1-(N,N-di-p-methoxyphenylamine) pyrene, 4,4'-cyclohexylidenebis[N,N-bis(4-methyl phenyl) benzenamine], 2,5-bis(4,4'-bis(methoxyphenyl) aminophen-4"-yl)-3,4-ethylene dioxythiophene, 2,3,4,5-tetra[4,4'-bis (methoxyphenyl) aminophen-4"-yl]-thiophene, 4,4',5,5'-tetra[4,4'-bis(methoxyphenyl)aminophen-4"-yl]-2,2'-bithiophene, 5,10,15,20-tetrakis(4-bromophenyl) porphyrin, 5,10,15,20-tetrakis(5-bromopyridine-2-yl) porphyrin, 5,10, 15,20-tetrakis(4-bromophenyl) porphyrin zinc(II), 5,10,15, 20-tetrakis(5-bromopyridine-2-yl) porphyrin zinc(II), and/ or 1,3,6,8-tetra (N, N-p-dimethoxyphenylamino)-9-ethylcarbazole, graphene oxide, copper pthalocyanine, 2,2', 7,7'-Tetra(N,N-di-p-tolyl)amino-9,9-spirobifluorene (spiro-TTB), carbon nanotubes, and EH44. Examples of suitable inorganic HTL materials include nickel oxide, copper oxide, copper indium sulfide, copper thiocyanate, copper chromium iodide, copper iodide, vanadium oxide, tin oxide, aluminum oxide, zinc telluride, cobalt zinc oxide, and/or tungsten oxide.

An ETL (e.g. CTLs 230B and 230D) may be constructed of an electron transport material (ETM) that includes at least one of an organic material and/or inorganic material. Fullerene $C_{60-70}$ and derivatives (e.g. PCBM, ICBA etc), LiF, bathocuproine, zinc oxide, magnesium oxide, indium oxide, niobium oxide, tungsten oxide, tin oxide, titanium dioxide, zinc oxide, vanadium oxide, [6,6]-phenyl $C_{61}$ butyric acid methyl ester (PCBM), naphthalene diimides, perylene diimides, calcium carbonate, electron accepting diimides, electron accepting dianhydrides, pyromellitic anhydride, and/or azaacene-based molecules, with or without a dopant.

Figure 4:
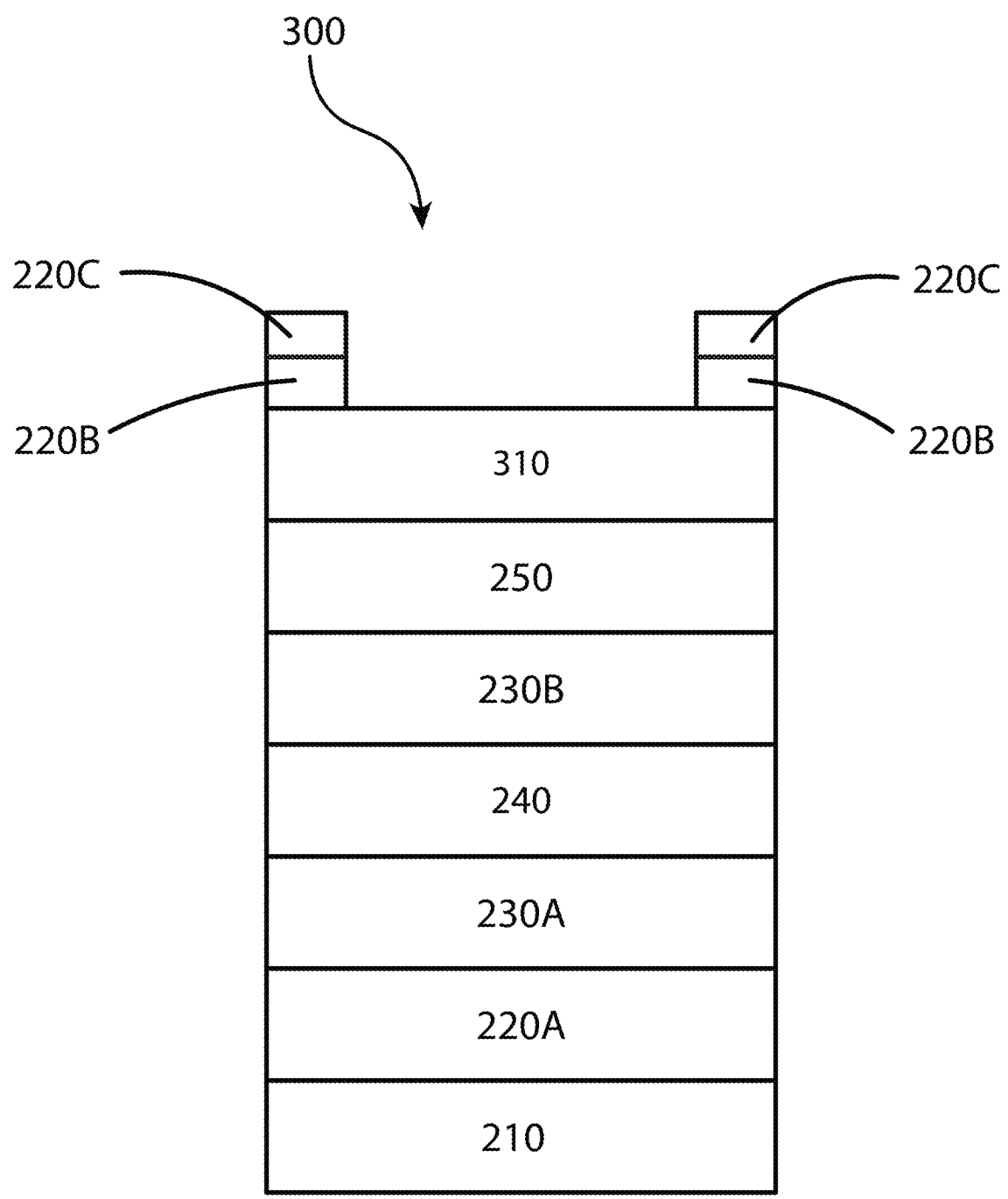
FIG. 4 illustrates an embodiment of a perovskite-containing optoelectronic device, incorporating a poly(ethylenimine) ethoxylated (PEIE) intervening layer, according to some embodiments of the present disclosure.

Referring to FIG. 4, in some embodiments of the present disclosure, a device 300 may include an intervening layer 250 of poly(ethylenimine) ethoxylated (PEIE), applied onto the top surface of an CTL 230B, in this case an ETL, of $C_{60}$ fullerenes. This exemplary device 300 may also include a perovskite p-i-n active layer 240. The intervening layer 250, in this case the PEIE layer, was applied by spin coating with a solution of PEIE in isopropanol. Subsequently, a barrier layer 310 of aluminum-doped zinc oxide (AZO) was placed by atomic layer deposition (ALD) onto the surface of the intervening layer 250 (e.g. PEIE). As shown herein, the resulting AZO barrier layer 310 grown on the PEIE intervening layer 250 was more conformal and a better environmental barrier than AZO grown on an ETL made of $C_{60}$. So, for this example, the AZO layer provides a layer that, among other things, electrically connects the other layers of the device. In some embodiments of the present disclosure, a layer positioned in a device like layer 310, may serve both as a contact layer and a barrier layer.

Referring again to FIG. 4, in some embodiments of the present disclosure, a device 300 may include, in order, a glass substrate 210, a first contact layer 220A of ITO on the substrate 210, a first CTL 230A of PTAA on the first contact layer 220A, a metal halide active layer 240 on the first CTL 230A, a fullerene second CTL 230B on the active layer 240, a PEIE intervening layer 250 on the second CTL 230B, an AZO barrier layer 310 on the intervening layer 250, and a gold second contact layer 220B on the barrier layer 310. In some embodiments of the present disclosure, a device 400 may include, in order, a glass substrate 210, a first contact layer 220A of ITO on the substrate 210, a first CTL 230A of PTAA on the first contact layer 220A, a metal halide active layer 240 on the first CTL 230A, a fullerene second CTL 230B on the active layer 240, a PEIE intervening layer 250 on the second CTL 230B, an AZO barrier layer 310 on the intervening layer 250, an IZO second contact layer 220B on the barrier layer 310. In some embodiments of the present disclosure, a device 300 may include, in order, a glass substrate 210, a first contact layer 220A of ITO on the substrate 210, a first CTL 230A of PTAA on the first contact layer 220A, a metal halide active layer 240 on the first CTL 230A, a fullerene second CTL 230B on the active layer 240, a PEIE intervening layer 250 on the second CTL 230B, an AZO barrier layer 310 on the intervening layer 250, an IZO second contact layer 220B on the barrier layer 310, and a gold and/or silver third contact layer 220C on the second contact layer 220B. In this embodiment, the second contact layer 220B and/or the third contact layer 220C is positioned on the barrier layer 310 as a mesh or grid instead of a conformal layer.

Figure 5:
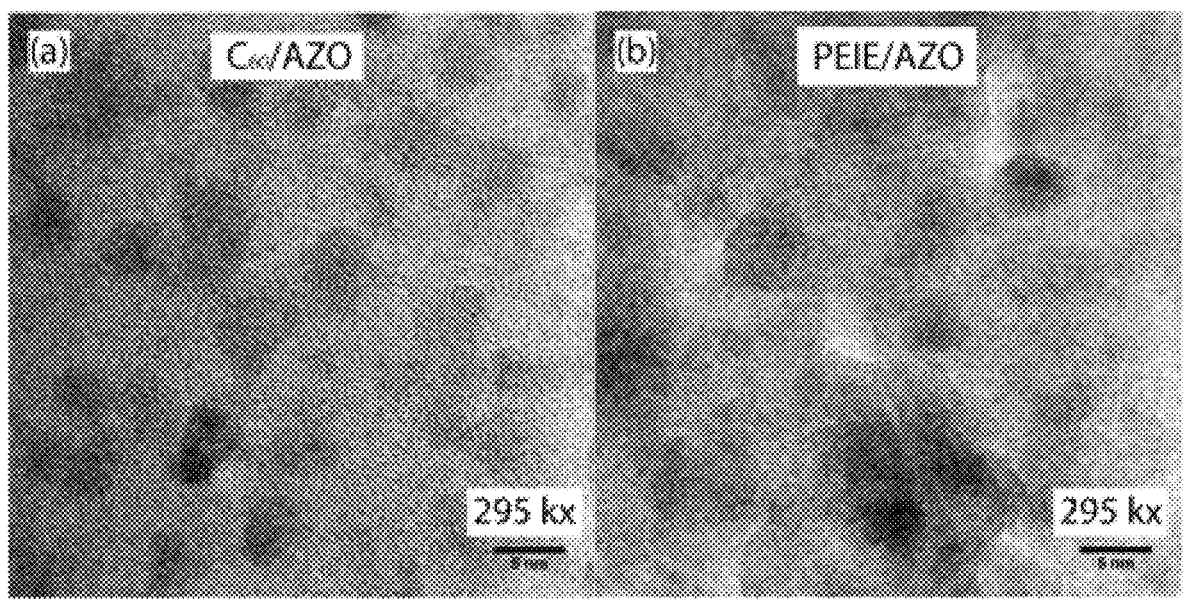
FIG. 5 illustrates transmission electron microscopy (TEM) images of an aluminum-doped zinc oxide (AZO) layer (a contact layer) grown by atomic layer deposition on a carbon coated copper electron microscopy grid with $C_{60}$ (fullerene) Panel (a) and $C_{60}$ followed by an intervening layer made of PEIE Panel (b), according to some embodiments of the present disclosure.

As shown herein, an AZO barrier layer 310 may be grown by ALD using a supercycle approach. One supercycle of AZO[1:19] consisted of 19 cycles of diethylzinc and water (zinc oxide ALD) followed by one cycle of trimethylaluminum and water (aluminum oxide ALD). The nucleation of an AZO[1:19] film was studied by transmission electron microscopy on the first nucleation layer 150 ($C_{60}$) and the second nucleation layer 160 (PEIE) deposited on a TEM grid (FIG. 5, Panels (a) and (b), respectively). These figures show crystalline lattice fringes consistent with zinc oxide crystallites. In Panel (a) of FIG. 5, it was observed that two supercycles of AZO[1:19] on $C_{60}$ at 100° C. resulted in distributed crystalline ZnO nanoparticles, consistent with an "island-like" or Volmer-Weber (VW) growth mode. Panel (b) of FIG. 5 shows that, under the same conditions, two supercycles of AZO[1:19] on the PEIE second nucleation layer 160 resulted in ZnO nanoparticles and planar sheets of crystalline ZnO that extended to the regions between the nanoparticles, indicating "layer-plus-island" or a Stranski-Krastanov (SK) growth mode. The SK growth mode is consistent with the more favorable surface chemistry of PEIE relative to $C_{60}$ and is likely to result in an ALD film (e.g. a barrier layer 310) that is both denser and more conformal.

Figure 6:
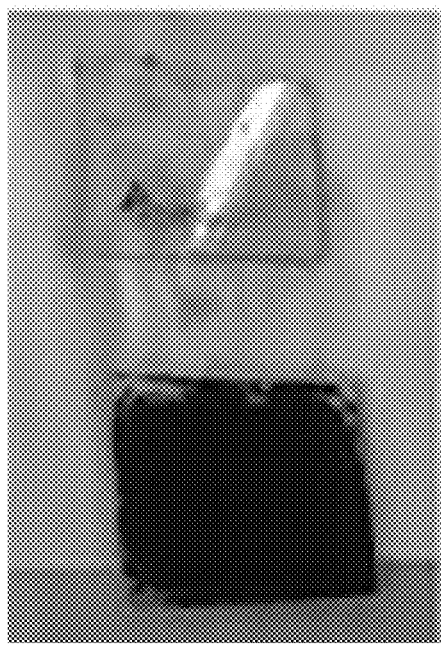
FIG. 6 illustrates photographs of perovskite-containing optoelectronic devices (e.g. solar cells) with a layer of fullerenes and an atomic layer deposited (ALD) AZO layer (contact layer), with (bottom colored device) and without (top lightly colored device) an intervening layer made of PEIE (left) placed between the $C_{60}$ and AZO layers and acid anhydride layer placed between the $C_{60}$ and AZO layers (right), according to some embodiments of the present disclosure. The samples were exposed to dimethylformamide (DMF) solvent for 15 seconds.
Figure 6:
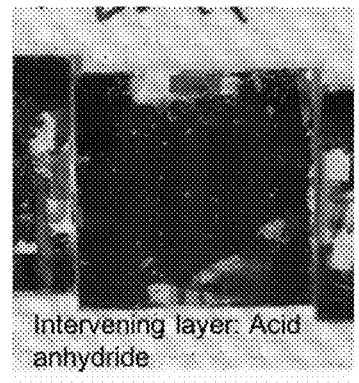

As demonstrated herein, the intervening layer 250, in this example PEIE, enables the deposition of conformal coatings that are at least one of conducting and/or a barrier, e.g. an oxide layer (AZO), by CVD and/or ALD, with the desirable result of the oxide layer (e.g. AZO) protecting the underlying perovskite active layer(s) 240 from damage due to ambient humidity and/or oxygen and reactive metal electrodes. In addition, a conformal coating can protect the underlying layers from damage caused by solvent exposure; this is especially relevant for manufacturing perovskite-perovskite tandem solar cells, where one or more perovskite layers are deposited on top of another without dissolving it. As shown in FIG. 6, an embodiment of the present disclosure allows ALD growth of sufficiently dense and conformal layers (e.g. oxide layers such as a contact layer 220) to prevent ingress of solvents from possible downstream manufacturing steps, isolating the perovskite active layer 240 from exposure to the solvents. The top device illustrated in FIG. 6, on the left side, is a stack of perovskite/C60/AZO, while the bottom device (on the left side) is a stack of perovskite/C60/PEIE/AZO (with PEIE as the intervening layer). The device containing the PEIE intervening layer remained dark, indicating its success as a barrier layer. The non-PEIE device bleached, indicated undesirable ingress of solvent into the device. The device illustrated on the right side of FIG. 6 is a stack of perovskite/C60/acid anhydride layer/AZO. Similar to the PEIE-containing device, it remained dark, indicating the ability of an acid anhydride layer to provide good barrier properties. FIG. 6 demonstrates that an intervening layer 250 may also enable a subsequently deposited oxide (e.g. AZO) layer to protect an underlying perovskite layer from degradation due to moisture and oxygen under light exposure.

Figure 7:
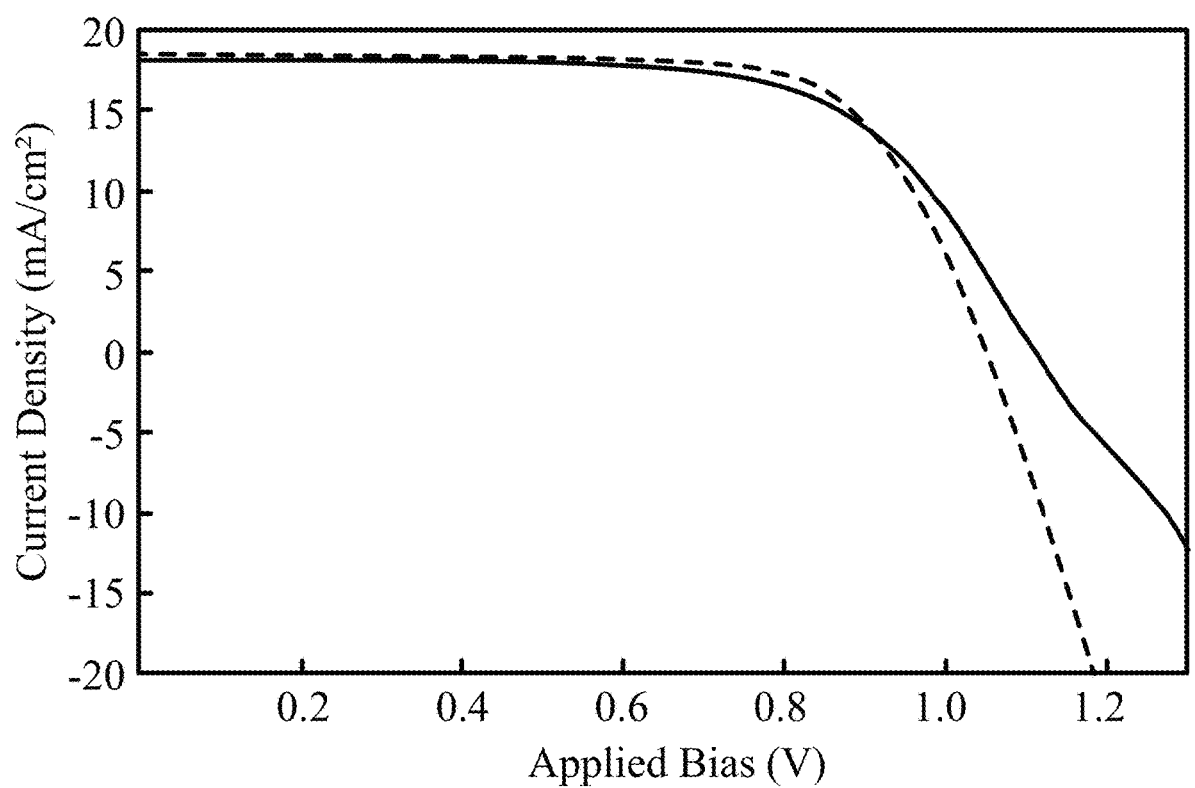
FIG. 7 illustrates current density-voltage curves for perovskite-containing optoelectronic devices made with (solid line) and without a PEIE intervening layer (dashed line), according to some embodiments of the present disclosure.

The density and conformality of ALD growth are related to the resistance across a deposited film. Resistance can be probed by measuring the resistance across a channel between two metal pads deposited on top of an ALD film. Lower resistance is indicative of a higher quality of the film and less torturous conduction pathways. Grown on glass (which provides surface OH groups available to react with ALD precursors/reactants) the measured resistance of the AZO film was 2.6 MOhm. Grown on $C_{60}$ fullerenes, which do not provide reactive sites, the measured resistance was 5.1 MOhm. When a PEIE intervening layer 250 was used on top of the fullerene, the resistance was the same or lower than when grown on glass; about 2.5 MOhm. This indicates good nucleation and growth of the AZO layer on top of the PEIE layer. It is desirable that the intervening layer 250 allow electrical current to flow out for the device to function as an optoelectronic device. FIG. 7 depicts current density—voltage curves for perovskite solar devices made with and without an intervening layer 250 of PEIE. The layer thickness of the intervening layer 250, e.g. PEIE, may be optimized to maximize photovoltaic performance. In some embodiments of the present disclosure, the thickness of an intervening layer 250 may be between greater than zero nanometers and about 10 nm. In some embodiments of the present disclosure, the thickness of an intervening layer 250 may be between greater than zero nanometers and about 5 nm. In some embodiments of the present disclosure, the thickness of an intervening layer 250 may be about 1 nm. This demonstrates the feasibility of implementing intervening layers into functioning perovskite solar cells.

Figure 8:
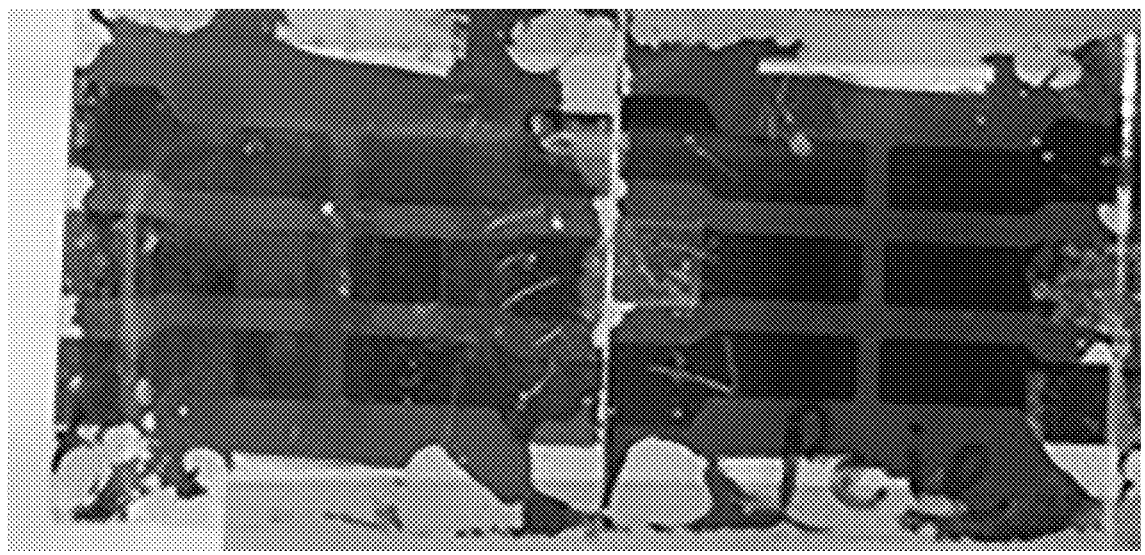
FIG. 8 illustrates photographs of unencapsulated solar cells with $C_{60}$/AZO/Al top contacts (left) and $C_{60}$/PEIE/AZO/Al contacts (right) after 500 hours exposure to continuous illumination at one sun intensity in ambient conditions, according to some embodiments of the present disclosure. The left device exhibits signs of degradation (a lightening underneath and next to the metal finger electrodes), while there is no observable degradation in the right device.
Figure 9:
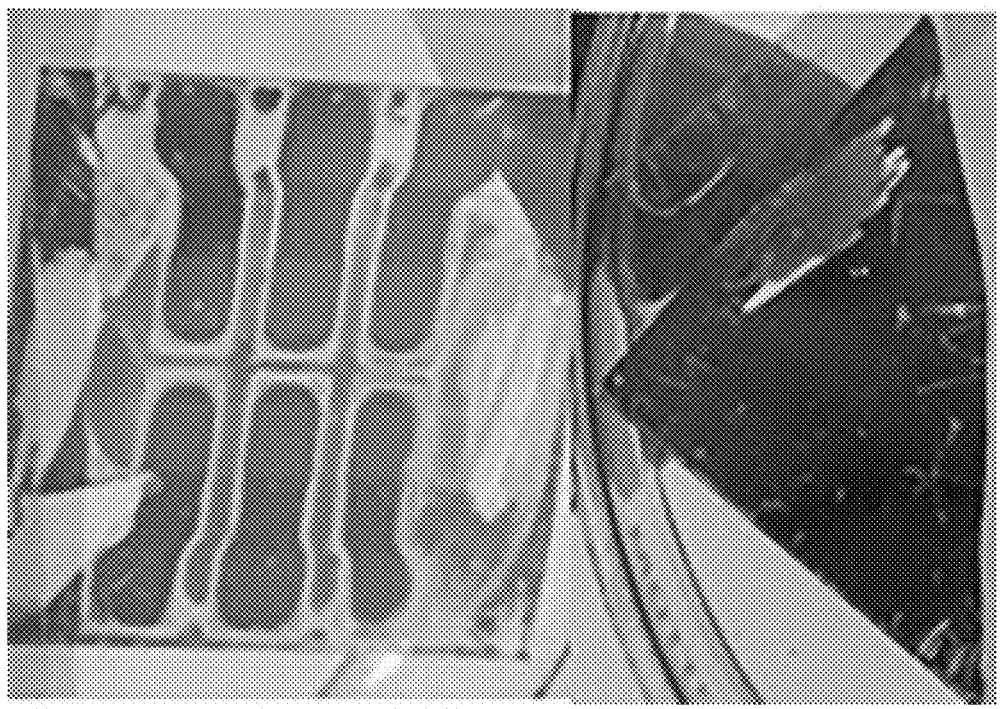
FIG. 9 illustrates photographs of unencapsulated solar cells with C60/AZO/Al top contacts (left) and $C_{60}$/PEIE/AZO/Al contacts (right) after 500 hours exposure to continuous illumination at one sun intensity in ambient conditions, according to some embodiments of the present disclosure. Here, the perovskite material contains tin (II), which may be prone to oxidation and accelerated degradation. The left device exhibits signs of degradation around the metal electrodes and the perovskite has become light brown in color indicating oxidation of the material, while there is no observable degradation in the PEW-containing device.

It is shown herein that the incorporation of a PEIE intervening layer 250 with a contact layer 220 of AZO, having barrier properties, and deposited by ALD, greatly improves the stability, at ambient conditions, of the resultant perovskite-containing optoelectronic devices, compared to devices not having these features. Such a comparison is illustrated by showing the effect of AZO growth with PEIE on the stability of silver contacts in FIGS. 8 and 9 for optoelectronic devices utilizing perovskite active layers 240 constructed of lead perovskite materials and tin-lead alloy perovskite materials, respectively. Referring to FIGS. 8 and 9, for each image, the device on the rights is with PEIE and on the left without PEIE. The PEIE device visually demonstrates that the PEIE provides a barrier effect and improved device durability.

As described herein, an intervening layer 250 may be of a chemical structure (by the nature of the nucleophilic surface functional groups) that promotes nucleation or wetting of an overlying barrier layer (e.g. layer 260 in FIG. 2) and/or interconnect layer (e.g. layer 310 in FIG. 3), such as an oxide layer. This may be achieved by modifying the surface energy of the intervening layer to promote oxide precursor (which may include a metal organic, an oxide vapor, or a metal chloride etc.) adsorption. In many cases, this may manifest itself in stronger bonding interaction between the intervening layer and the subsequently deposited oxide layer, such as through covalent bonds. Another manifestation of this effect may be the increased abruptness of the intervening layer/oxide interface with reduced growth/diffusion of the oxide layer into the underlying intervening layer as a result of stronger precursor-surface interactions reducing subsurface diffusion. The effects of promoted adsorption may be improved oxide layer properties and may include, but are not limited to, at least one of the following physical properties and/or performance metrics: increased conformality, uniformity, water barrier properties, solvent barrier properties, halide barrier properties, oxygen barrier properties, mechanical strength, crystallinity, refractive index, density, and/or electrical conductivity.

According to some embodiments of the present disclosure, methods for detecting such improved physical properties and/or performance metrics, as a result of the improved bonding interactions between an intervening layer as described herein and the layer adjacent to the intervening layer, subsequently deposited, include:

1. X-ray photoelectron spectroscopy by sputter depth profiling using a gentle sputter process (e.g. argon gas cluster ion beam sputtering may show a change in the bonding environment of the intervening layer or oxide layer as determined by a chemical shift of the elemental peaks. Changes may occur to the oxygen, metal, and carbon bonding environments. In some cases, a narrowing of the core levels may occur in the presence of an intervening layer, as this may produce a more uniform chemical/bonding environment, enabling the intervening layer to nucleate on the underlying layer. In some cases, where in intervening layer is adjacent to a subsequently deposited layer that includes a metal oxide (e.g. ZnO, ZnTe, ZnSe, $Al_2O_3$, $Ga_2O_3$ etc.) changes in the valance in the photoemission spectroscopy may be observed.
2. Fourier transform infrared spectroscopy by looking for changes in vibrational, rotational, or bending modes in the intervening layer material as a result of chemical bonding during oxide deposition; e.g. reduction in O—H stretching (about 3300-2500 $cm^{-1}$), N—H stretching (about 3500-3300 $cm^{-1}$), or shifts in C—O (about 1250-1050 $cm^{-1}$) and/or C—N stretching (about 1230-1020 $cm^{-1}$).
3. High resolution elemental mapping by Auger electron spectroscopy to measure the uniformity/conformality/abruptness of the intervening layer/oxide interface.
4. Transmission electron microscopy and/or transmission electron microscopy energy dispersive x-ray spectroscopy to measure the oxide layer crystallinity and uniformity/conformality/abruptness of the intervening layer/oxide interface.
5. Energy dispersive X-ray fluorescence spectroscopy (EDX and EDS) at the interface, probing changes in oxygen, metal, nitrogen, or carbon emission spectrum due to chemical interaction between metal oxide and intervening layer.
6. Ellipsometry to measure the optical properties (e.g. refractive index) of the oxide layer to probe increases in material density.
7. X-ray reflectivity to measure the optical properties (e.g. refractive index) and density of the oxide layer.
8. Mechanical/fracture tests to determine the mechanical strength of the intervening layer/oxide layer interface. For example, delamination may occur at an interface that may otherwise not occur in a device containing an intervening layer as described herein. For example, in a device lacking an intervening layer, delamination may occur between an active layer and at least one of a neighboring ETL/HTL layer, a contact layer, and/or an interconnect layer, whereas such delamination would not occur in a device containing an intervening layer, as described herein.
9. Transmission rate measurements of water vapor, solvent, metal ions, halides, molecules, or other ions to determine barrier properties of the stack.

In some embodiments of the present disclosure, one or more of the methods described above may be used together to determine the presence (or absence) of an intervening layer, as described herein.

The solvent test may be conducted as follows on a perovskite solar cell: the sample is immersed in 100% DMF for 30 seconds at room temperature before drying with a blow gun and heating at 100 C for 5 minutes. If an intervening layer is used, the sample will retain over 90% of its coverage by a perovskite layer, as quantified by a microscope and image analysis. For solar cells other than those containing perovskites, suitable solvents will be chosen—for example for PV using organic polymers or small An intervening layer 250 was also implemented on perovskite films deposited on flexible polyethylene napthalate (PEN) substrates 210. In an optoelectronic device having of a stack of PEN/perovskite/$C_{60}$/PEIE/AZO/Ag (substrate 210/active layer 240/CTL 230/intervening layer 250/barrier layer 310/contact layer 220), it was determined that the intervening layer 250 improved adhesion of the AZO contact layer 220 to the underlying stack elements, e.g. to the perovskite active layer 240, preventing delamination under flex tests. Table 1 shows that flexing the substrate 210 in both tension and compression resulted in no measurable difference in film resistance. Without the PEIE intervening layer 250, delamination of the AZO contact layer 220 and the CTL 230 was observed.

Figure 10:
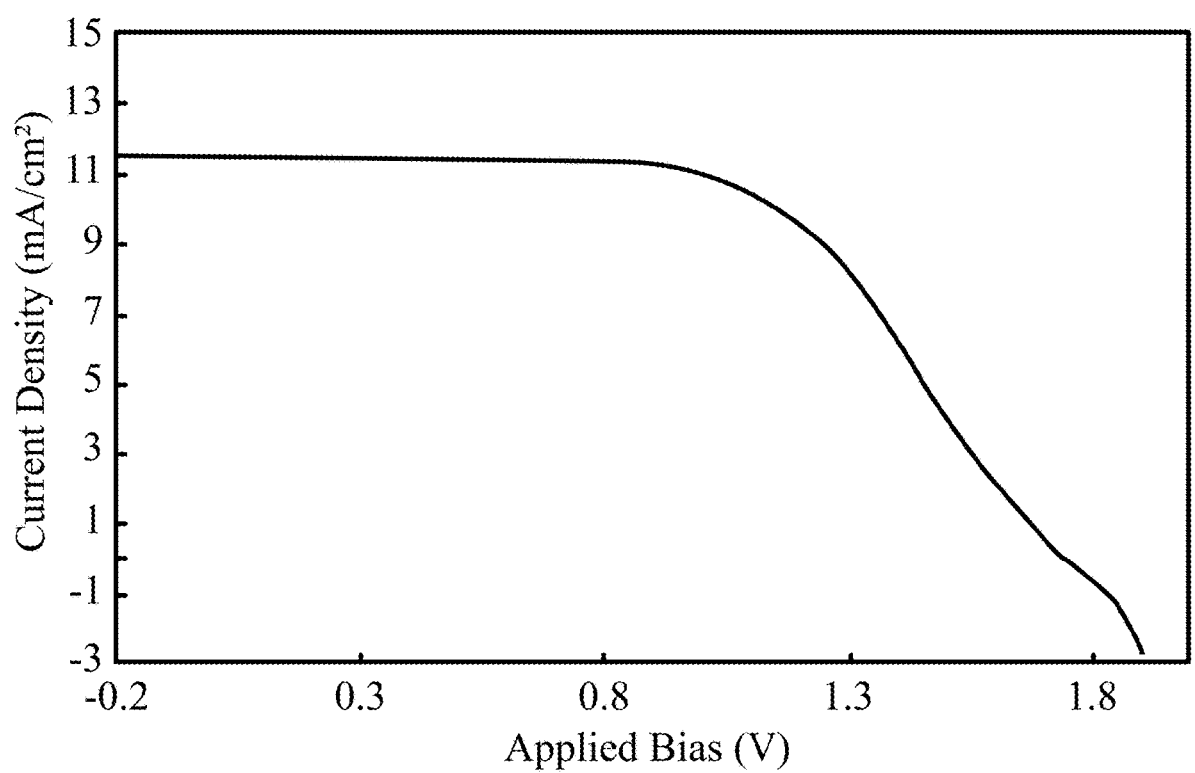
FIG. 10 illustrates current density-voltage curves for a solution processed perovskite tandem solar cell using an intervening layer before depositing an AZO interconnect layer via ALD. The voltage (1.76 V) is the sum of the two subcells (1.05 and 0.72, respectively). This demonstrates the use of features of the present disclosure to enable production of tandem PV devices.

It is demonstrated herein that a PEIE second intervening layer 250, together with an ALD deposited AZO layer may behave as an interconnect layer 260 between two perovskite active layers (240A and 240B) in a perovskite-perovskite tandem solar device 200, as illustrated in FIG. 3. In this application, the interconnect layer 260 served two purposes: 1) behaving as a barrier layer to enable solution processing of one perovskite active layer on top of another, and 2) as a recombination layer enabling voltage stacking of the two active layers (240A and 240B). FIG. 10 illustrates the J-V curve of such a tandem device. The device structure was glass/ITO/polyTPD/PFN/$DMA_{0.1}Cs_{0.3}FA_{0.6}Pb(I_{0.8}Br_{0.2})_3$/$C_{60}$/PEIE/AZO/ITO/PEDOT/$FA_{0.75}Cs_{0.25}Sn_{0.5}Pb_{0.5}I_3$/$C_{60}$/BCP/Ag.

TABLE 1

Resistance measurements (same design as the bottom device shown in FIG. 6) across AZO layers deposited with PEIE nucleation layers on top of perovskite material on flexible PEN substrates. The resistance of the material does not change upon bending (0.5 cm bending radius) in either tensile or compressive mode. This enables applications in flexible form factors for perovskite single and multi-junction solar cells with improved stability.

| Test | Resistance (Mohm) |
|---|---|
| As made | 1.4 |
| 10 bends (0.5 bend radius) tension | 1.4 |
| 10 bends (0.5 bend radius) compression | 1.4 |

As shown herein, some embodiments of the present disclosure utilize an intervening layer, for example a thin polymer having nucleophilic hydroxyl groups and/or amine groups that enable the forming of a conformal, low-conductivity aluminum zinc oxide layer by atomic layer deposition (ALD) and/or other PV layers/elements by other deposition methods (e.g. evaporative methods, sputtering, solution processing, etc.). Such ALD-deposited oxide layers may behave as interconnects that reduce shunting as well as solvent degradation from solution processing to perovskite layers underlying the intervening layer the ALD-deposited oxide layer. In some embodiments of the present disclosure, semicrystalline aluminum-doped zinc oxide (AZO) was deposited by ALD onto a PEIE intervening layer. This allowed more design flexibility, including reduction of the sputtered TCO thickness, enabling control over the lateral resistivity of the interconnect layer. The lateral resistivity was increased to reduce the likelihood of electrically connecting any shunt paths in either subcell and thus improve the device fill factor.

Further, by exploiting the improved ALD based recombination layer, a method that allows the depositing of the low-gap material directly on the wide-gap DMA-containing cell was enabled. This approach solves the general problem of subcell integration and the specific problem of the wide-gap instability that plagued the previous implementations of all-perovskite tandems and subsequently results in the ability to manufacture all-perovskite tandem solar cells having improved fill factors, voltages, and stable efficiencies of up to 23.1%. Using the flex-compatible nature of the recombination layer developed, devices were successfully built on flexible plastic substrates, attaining efficiencies of 21.3%. These results demonstrate the most efficient flexible thin film solar device of any non-III-V technology made to date, showing the potential for perovskite tandem devices to excel in applications where lightweight and flexible devices are required, and also providing a high value early market for perovskite optoelectronic devices. The use of flexible substrates is crucial in particular, as this is one of the most important stepping stones towards massive scalability via roll-to-roll processing.

Carrier recombination between the subcells (e.g. the first and second active layers) of a tandem device is a particular challenge resulting from the combination of electrical and practical considerations that must be realized; specifically it should enable the appropriate device physics of the tandem with minimal loss, while enabling material integration of top and bottom cells. The ideal recombination layer, referred to herein as an interconnect layer, enables voltage addition between the perovskite subcells, resulting in minimal optical losses (especially in the near-IR, where the rear low gap cell absorbs), and exhibits maximum out-of-plane conduction with minimal lateral conduction. These parameters can be achieved with conformal, ultra-thin oxide films.

Figure 11:
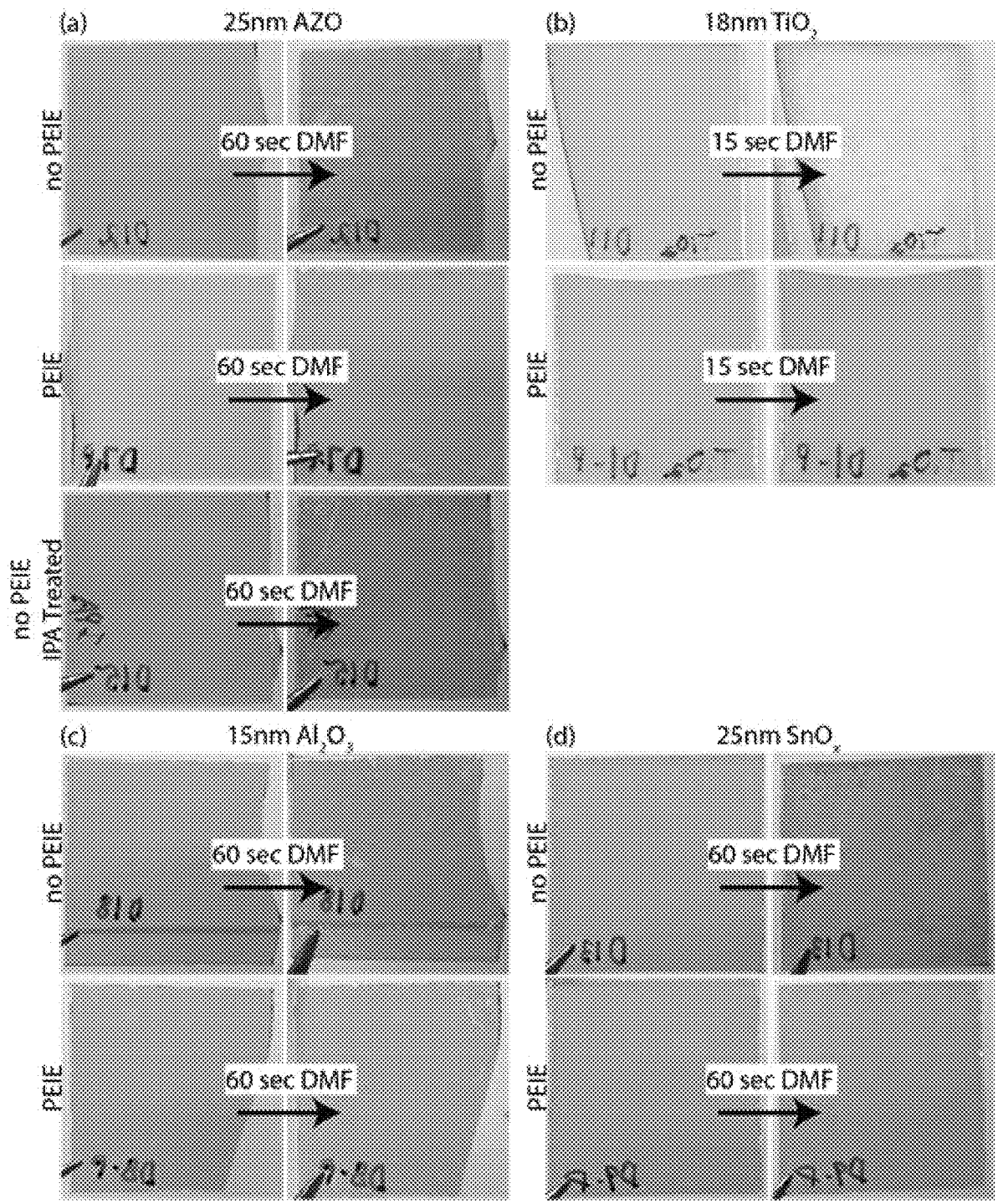
FIG. 11 illustrates DMF degradation tests on glass/evaporated $PbI_2$/30 nm $C_{60}$/ALD metal oxide, where Panel (a) the metal oxide is 25 nm AZO grown with trimethylaluminum, diethylzinc, and water, Panel (b) 18 nm $TiO_2$, grown by titanium tetrachloride and water, Panel (c) 15 nm $Al_2O_3$, grown by trimethylaluminum and water and Panel (d) 25 nm $SnO_x$ grown by tetrakis(dimethylamino)tin(IV) and water. All processes were deposited at 85° C.

A wide-gap perovskite active layer may be fabricated in an inverted p-i-n architecture, terminated by an n-type $C_{60}$ layer (ETL); the ALD-grown interconnect layer may be deposited on top of the $C_{60}$ film. The poor barrier properties of ALD-grown metal oxides on bare $C_{60}$ results in the use of thick (100 nm) sputtered TCO layers to provide adequate solvent resistance for depositing of the second perovskite active layer. For example, perovskite films protected with just $C_{60}$ (30 nm) and ALD deposited AZO (25 nm) are susceptible to solvent (both water and DMF) degradation on the time-scale of seconds (see FIG. 11). Similar results are observed with other ALD oxides on $C_{60}$, including $TiO_2$, $Al_2O_3$, and $SnO_x$ (see FIG. 11). Unlike ALD growth on inorganic surfaces, ALD precursors can diffuse into polymer or small molecule substrates, resulting in subsurface growth. When the organic is chemically inert to the ALD metal-organic, a rough and diffuse interface often forms; nucleophilic functional groups reactive to metalorganics (e.g. hydroxyl, carbonyl, or amine) can increase the abruptness of the organic/ALD metal oxide interface. The weak barrier properties of the $C_{60}$/AZO stack may result from poor nucleation of ALD-grown metal oxide films on the chemically-inert $C_{60}$ surface, resulting in porous, non-continuous layers.

Figure 12A:
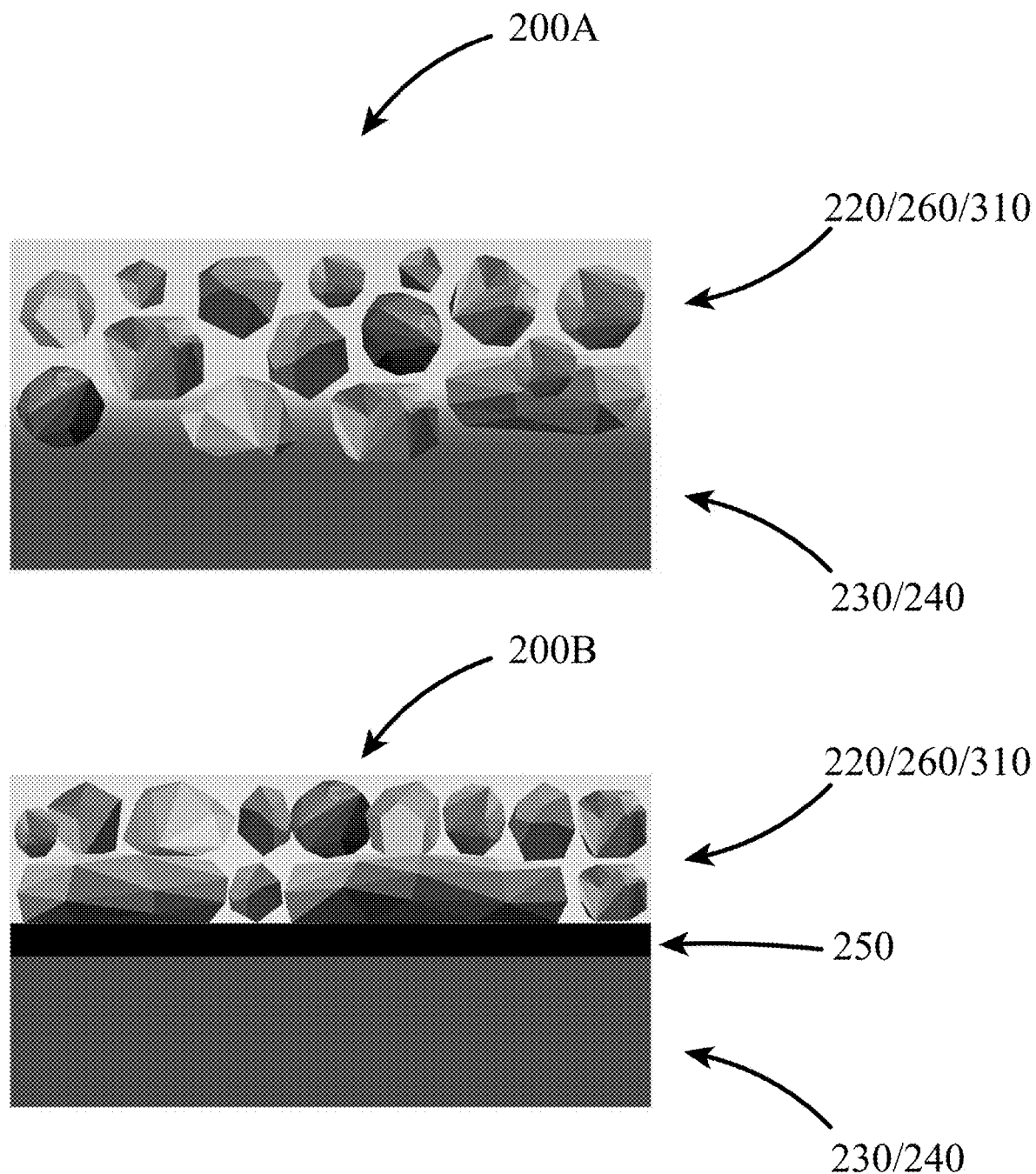
FIG. 12A illustrates a schematic depicting AZO growth on a surface (e.g. a perovskite and/or a fullerene), with (bottom) and without (top) an intervening layer (e.g. PEIE), according to some embodiments of the present disclosure.
Figure 12B:
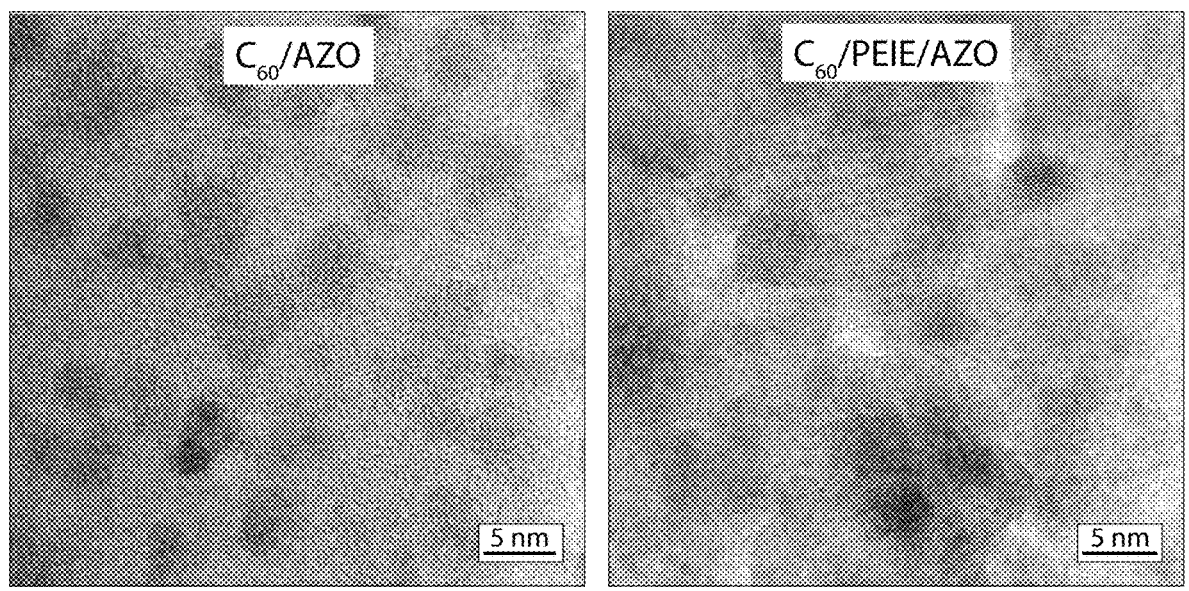
FIG. 12B illustrates transmission electron microscopy images of (left) 5 nm $C_{60}$/4 nm AZO and (right) 5 nm $C_{60}$/PEIE/4 nm AZO showing differences in AZO structure at the $C_{60}$ interface, according to some embodiments of the present disclosure.
Figure 13:
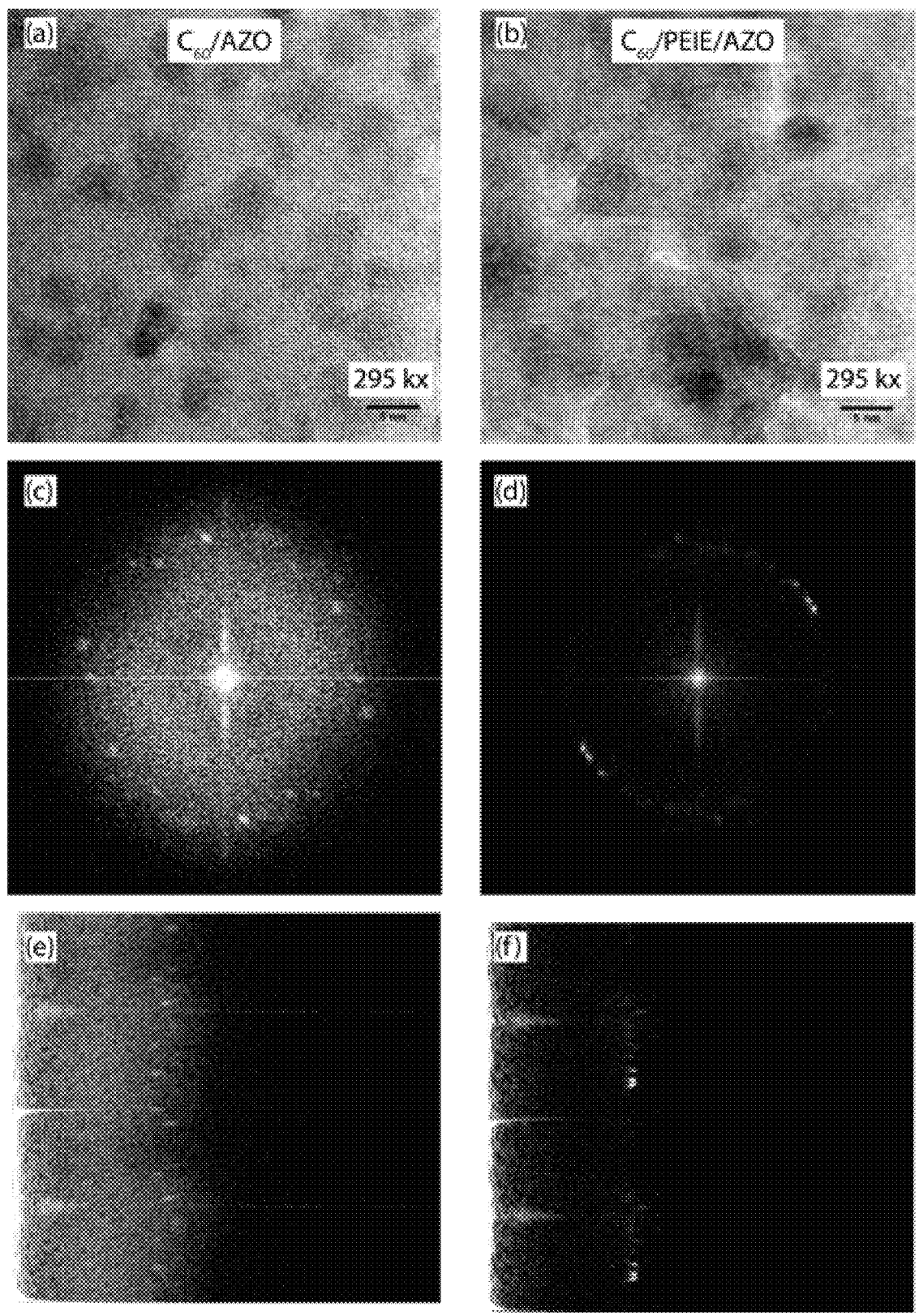
FIG. 13 illustrates transmission electron microscopy (TEM) images of (Panel a) 5 nm $C_{60}$/4 nm AZO and (Panel b) $C_{60}$/PEIE/4 nm AZO on TEM grids (on a carbon coated copper electron microscopy grid). Fast Fourier transforms (Panels (c) and (d)) and radially integrated fast Fourier transforms (Panels (e) and (f)) are shown of TEM images (Panels (a) and (b), respectively), according to some embodiments of the present disclosure.
Figure 14:
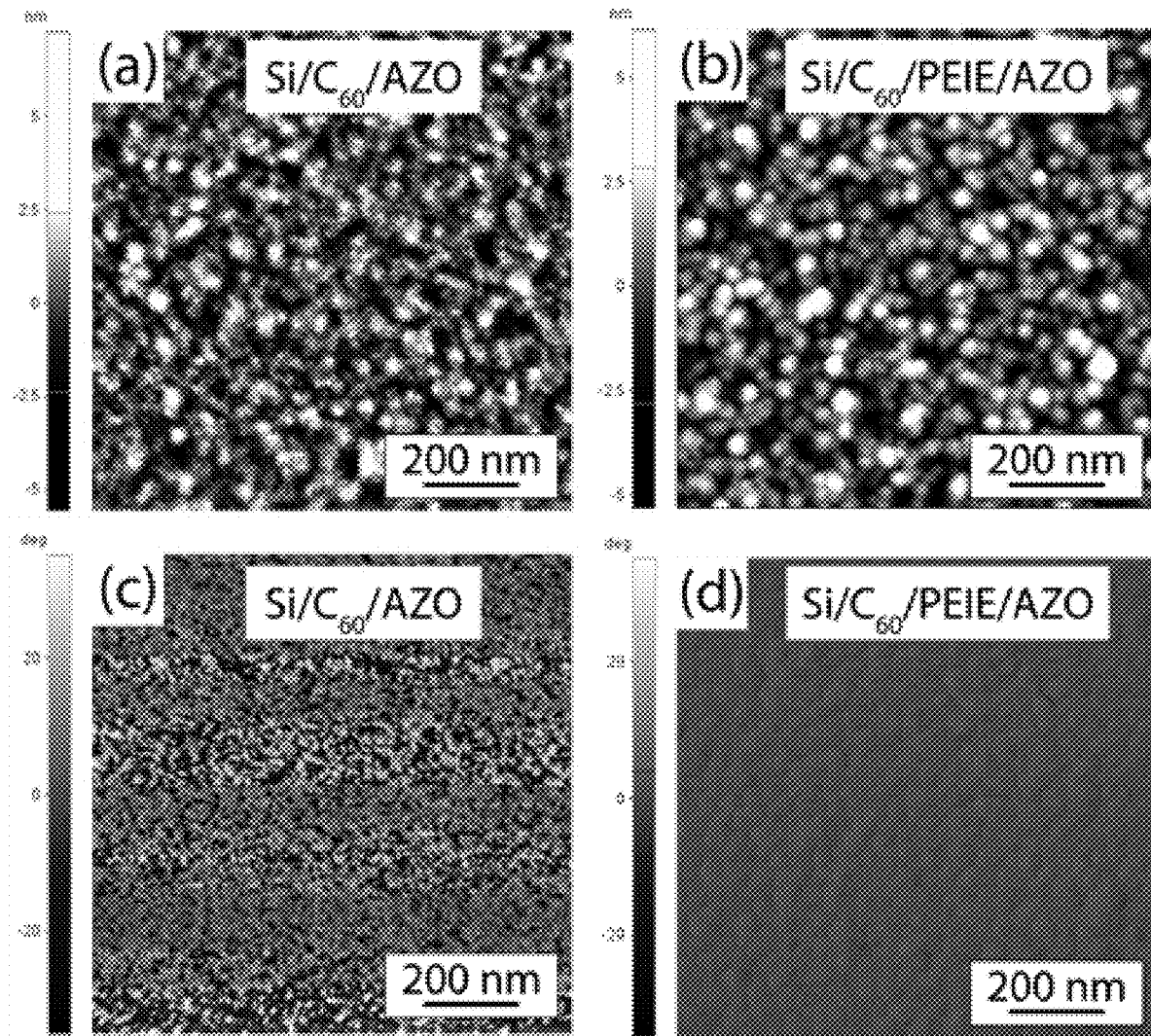
FIG. 14 illustrates atomic force microscopy of 3 cycles $Al_2O_3$+2 supercycle AZO (4 nm) on Si/30 nm $C_{60}$/(PEIE). Panels (a) and (b) illustrate topography without and with a PEIE intervening layer; surface roughness is 1.3±0.1 nm and 1.5±0.2 nm respectively; Panels (c) and (d) illustrate phase angles without and with PEIE, respectively, according to some embodiments of the present disclosure. ("Supercycle" is defined below.)

Therefore, on objective of the present disclosure is to improve the ALD growth behavior on $C_{60}$ using a thin (1 nm) intervening layer, for example poly(ethylenimine) ethoxylated (PEIE)—a polymer chain containing both hydroxyl and amine functional groups. These nucleophilic functional groups can initiate nucleation and reaction with the metal-organic precursors used for metal-oxide ALD. The two growth modes of AZO on $C_{60}$ with and without PEIE treatment are depicted in FIG. 12A. FIG. 12A illustrates that, in some embodiments of the present disclosure, a device 200B, having an intervening layer 250 may enable the subsequent forming of a better quality layer on top of the intervening layer 250, where the better quality layer may be, for example, at least one of a contact layer 220, an interconnect layer 260, and/or a barrier layer 310, where such layers may be constructed of an oxide, such as, but not limited to AZO. Referring again to FIG. 12A, an intervening layer 250 (e.g. PEIE) may enable improved forming of a subsequent oxide layer, resulting in at least one of a more conformal oxide layer, an oxide layer having fewer pinholes, a smoother surface, etc. Significant differences in AZO nucleation under these two conditions are evident. FIG. 12B shows transmission electron microscopy images of $C_{60}$/4 nm AZO (left) and $C_{60}$/PEIE/4 nm AZO (right), illustrating the effect of PEIE on AZO growth near the $C_{60}$ interface. AZO films grown on $C_{60}$ nucleated as small crystallites whereas AZO films grown on PEIE formed a combination of larger, crystalline sheets as well as crystallites. Fast Fourier Transform analysis of the TEM images (see Panels (a) and (b) of FIG. 13) show a higher degree of order with PEIE-nucleated AZO, consistent with the observation of larger crystalline AZO sheets. Further nucleation differences are observed through atomic force microscopy (AFM), as shown in FIG. 14. While 4 nm AZO films grown on $C_{60}$ and $C_{60}$/PEIE have a similar root-mean-square surface roughness of 1.3±0.1 nm and 1.5±0.2 nm, respectively, the phase angle shows differences in surface coverage. The phase angle represents the tip response to interactions with the sample and a uniform surface has a continuous phase angle response. The phase angle of 4 nm AZO on $C_{60}$ (see Panel (c) of FIG. 14) shows non-uniformity with islands surrounded by darker regions that we believe to be exposed $C_{60}$. In contrast, the phase angle of PEW-nucleated AZO (see Panel (d) of FIG. 14) is uniform, indicating more complete coverage at thin AZO thicknesses. It may be inferred that the surface coverage depends on the mode of nucleation, with the PEIE-induced nucleation providing superior coverage.

Figure 12C:
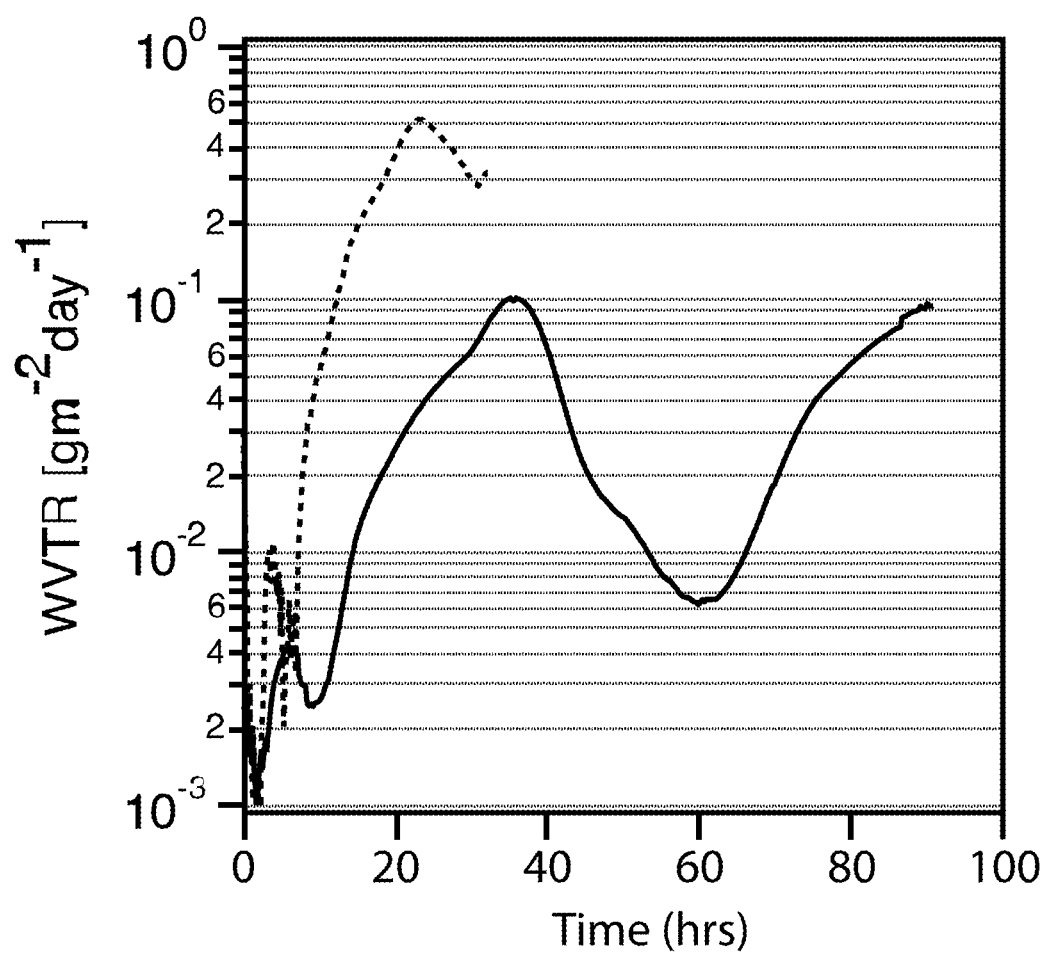
FIG. 12C illustrates water vapor transmission rates of 25 nm AZO as a function of time grown on bare $C_{60}$ (dashed line) and $C_{60}$ functionalized with a PEIE intervening layer (solid line); the average WVTR values are $2.8 \times 10^{-1}$ and $2.9 \times 10^{-2}$ g/($m^2$ day), respectively, according to some embodiments of the present disclosure.
Figure 12D:
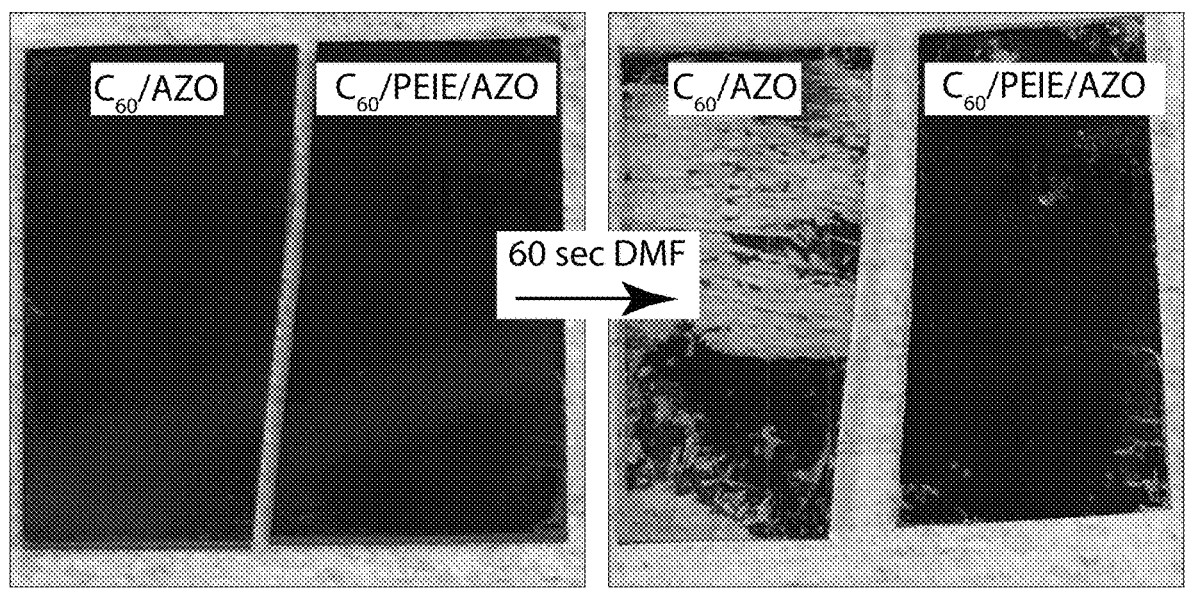
FIG. 12D illustrates (Panel A) $FA_{0.6}Cs_{0.3}DMA_{0.1}PbI_{2.4}Br_{0.6}$ perovskite sample split in two encapsulated with 30 nm $C_{60}$/25 nm AZO on the left and 30 nm $C_{60}$/PEIE/25 nm AZO on the right, and (Panel B) illustrates the same perovskite sample after 60 sec of dimethylformamide (DMF) exposure, according to some embodiments of the present disclosure.

Next, the effect these nucleation properties have on device-thickness (25 nm) films was investigated. The presence of a PEIE intervening layer decreased the water vapor transmission rate (WVTR) nearly a full order of magnitude from $2.8 \times 10^{-1}$ gm$^{-2}$ day$^{-1}$ with no nucleation layer to $2.9 \times 10^{-2}$ gm$^{-2}$ day$^{-1}$ with PEIE (see FIG. 12C—dashed line=$C_{60}$/AZO, solid line=$C_{60}$/PEIE/AZO) and substantially improved barrier properties against DMF permeation for ALD-grown AZO (see FIG. 12D) as well as a broader range of ALD systems, including $TiO_2$, $Al_2O_3$, and $SnO_x$ (see FIG. 11). The sheet resistance, measured by four-point probe, of the 30 nm $C_{60}$/25 nm AZO stack decreased from $4.1 \times 10^9 \pm 1.7 \times 10^9 \Omega/\square$ to $9.2 \times 10^8 \pm 4.7 \times 10^8 \Omega/\square$ with PEIE treatment of the $C_{60}$ surface.

No significant change in the AZO film thickness was observed by spectroscopic ellipsometry when AZO was deposited in these two architectures and PEIE intervening layer itself did not offer any significant barrier properties or lateral electrical conductivity, suggesting the aforementioned differences arise from material quality rather than the film thickness. As shown in this example, the use of an intervening layer (e.g. PEIE) for the forming of subsequent improved ALD-grown oxides (or other layers grown by ALD and/or other deposition methods) that can then behave, among other things, as effective barrier layers to subsequent processing steps and/or the environment may serve as a successful platform for the monolithic integration of two or more perovskite absorbers.

As describe above, the ALD AZO layer is an effective solvent barrier to both water and DMF. This enables the interconnect layer to be tailored by eliminating the thick transparent conducting oxide (TCO) used in previous devices; the new resultant device now only included conductive oxides (i.e. AZO/IZO), enabling rapid recombination and effective contact to the low bandgap subcell rather than also providing solvent barrier properties. Maximizing sheet resistance while maintaining mobility permitted this layer to provide an effective series connection between the two perovskite active layers. Ideally, minimizing lateral conductivity of the interlayer is desirable to prevent connection of shunt pathways that may be spatially dislocated in each subcell. One way to do this is to reduce the thickness of the TCO layer. As shown herein, devices with no sputtered TCO at all (the interconnect layer consisted of AZO/PEDOT:PSS) suffered from large charge extraction barriers and resultantly low fill factors. This is presumably due to a reaction between the acidic PEDOT:PSS solution and the acid-sensitive AZO. As determined in this work, at least 10 nm thicknesses of ITO or IZO was important to minimize damage from the PEDOT and enable high fill factors when regular acidic PEDOT:PSS dispersions were used. However, using pH-neutral PEDOT:PSS dispersions enabled the fabrication of efficient tandems with just 5 nm thicknesses of IZO. Such thin (between about 5 nm and about 15 nm) IZO layers, made with lower conductivity IZO (by increasing oxygen partial pressure during the sputter process) resulted in interconnect layers with sheet resistances on the order of 10-100 K$\Omega$/sq. This high sheet resistance inhibited lateral conduction to shunt pathways while the 5-15 nm of resistive TCO layers had minimal effect on the series resistance (out-of-plane charge transport), resulting in a high fill factor and voltage.

According to some embodiments of the present disclosure, a full tandem device stack was constructed and tested, that included in order; 1) an ITO/glass or ITO/PEN layer, 2) a layer of poly(N,N'bis-4-butylphenyl-N—N'-bisphenyl) benzidine (Polytpd) with a thickness of less than 5 nm, 3) a layer of poly(9,90bis(3'-((N,N-dimethyl)-N-ethylammonium)-propyl)-2,7-fluorene)-alt-2,7-(9,9-dioctylfluorine)] (PFN-Br) with a thickness of less than 1 nm, 4) a first layer of perovskite (e.g. DMAFACsPbIBr) having a thickness of about 300 nm, 5) a layer of LiF (a thickness of about 1 nm), 6) a layer of $C_{60}$ fullerenes (a thickness of about 30 nm), 7) a layer of PEIE (a thickness of less than 1 nm), 8) a layer of aluminum-doped zinc oxide at a thickness of about 25 nm, 9) an ITO layer at a thickness of about 5 nm, 10) a layer of poly(3,4-ethylenedioxythiophene) polystyrene sulfonate (PEDOT:PSS) at a thickness of about 20 nm, 11) a second layer of perovskite (e.g. FACsPbSnI with a thickness of about 750 nm, 12) a layer of $C_{60}$ fullerenes (a thickness of about 30 nm), 13) a layer of bathocuproine (BCP) with a thickness of about 6 nm, and 14) a layer gold at a thickness of about 100 nm.

Figure 15A:
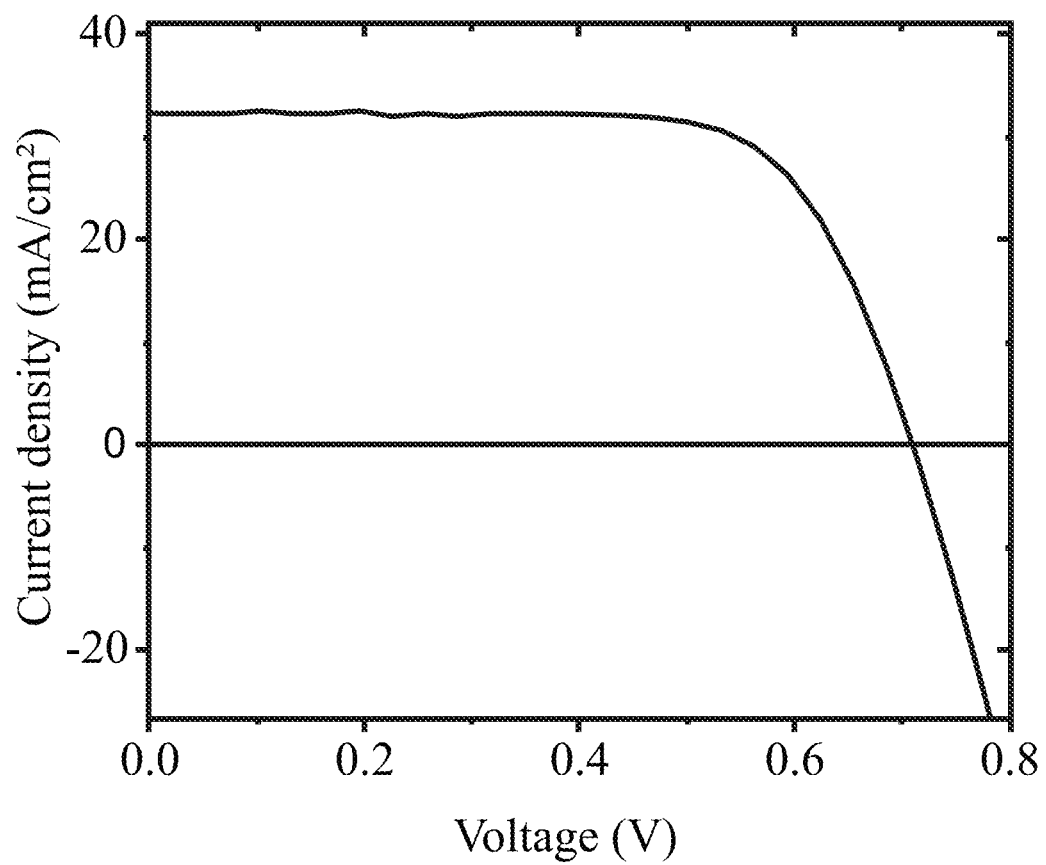
FIG. 15A illustrates current-voltage characteristics under AM1.5 illumination for a single junction low gap solar cell, according to some embodiments of the present disclosure.
Figure 15B:
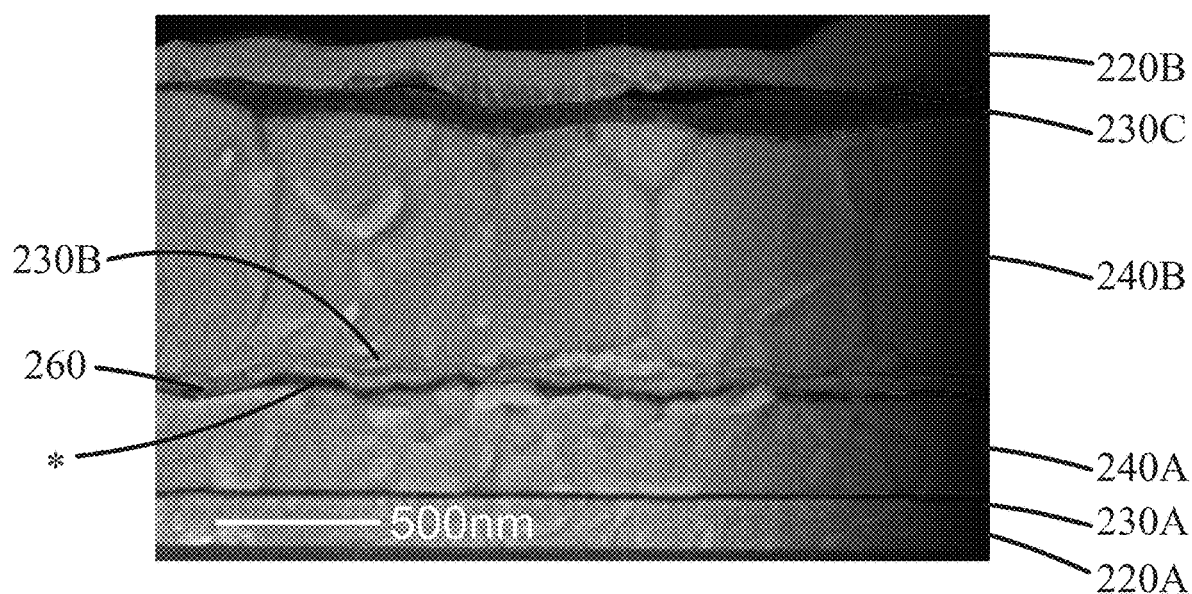
FIG. 15B illustrates a cross-sectional scanning electron micrograph of an all-perovskite tandem, according to some embodiments of the present disclosure.
Figure 15C:
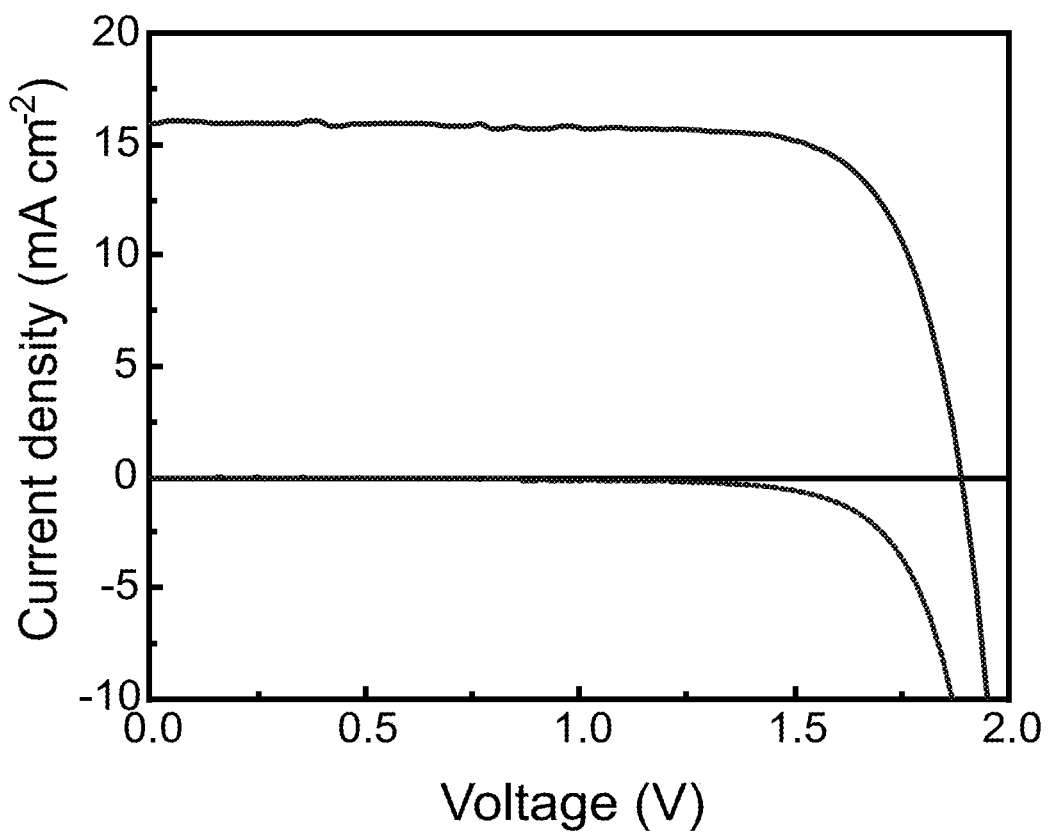
FIG. 15C illustrates current-voltage characteristics for an all-perovskite tandem device, measured under AM1.5 illumination and ensuring minimal (<1.5%) mismatch between subcells, according to some embodiments of the present disclosure. ($J_{sc}$=16.0 mA/cm2, $V_{oc}$=1.88 V, FF=0.77, PCE=23.1%)
Figure 15D:
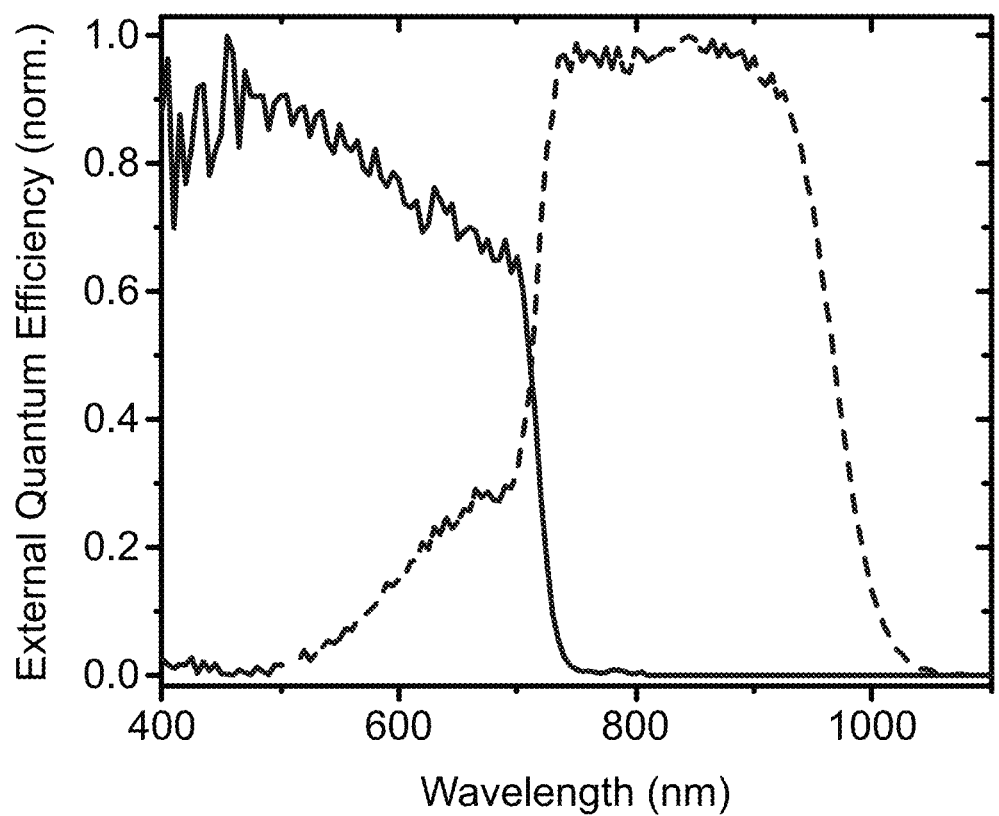
FIG. 15D illustrates normalized external quantum efficiency spectra for the sub-cells of the same tandem, according to some embodiments of the present disclosure.

A cross-sectional scanning electron micrograph of this tandem device is shown in FIG. 15B. This device includes, in order, a first contact layer 220A of ITO, a first charge transport layer 230A of (PolyTPD/PFN), a first active layer 240A of a wide bandgap perovskite material, a combination of layers (indicated with a *) including a second charge transport layer of LiF/C60 (not labeled) and an intervening layer of PEIE (not labeled), an interconnect layer 260 of AZO/IZO, a third charge transport layer 230B of PEDOT:PSS, a second active layer 240B, a fourth charge transport layer 230C of C60/BCP, and a second contact layer 220B of gold. Current-voltage characteristics for an all-perovskite tandem device are shown in FIG. 15A ($J_{sc}$=32.4 mA/cm$^2$; $V_{oc}$=0.71 V; FF=0.71, and PCE=16.3%). A 180 nm-thick layer of LiF was evaporated onto the glass side of the device as an antireflective coating. Optimization of the current matching in the perovskite active layers enabled attainment of 16.0 mA/cm$^2$ in the tandem, corresponding to the current flowing through both subcells as defined by the current-limiting cell. Further, by combining the advancements described herein in improving the wide gap subcell and the interconnect layer, an open-circuit of 1.88 V and FF of 77% were obtained, which are a significant improvement over the previous generation of devices. Together these performance parameters yield a power conversion efficiency of 23.1%. Initial tests were also performed to validate the inherent stability of our tandem architecture, which show a 21.5% tandem was operated at maximum power point under one sun for 13 hours with no observable drops in performance (see FIG. 15H), while another tandem device exhibited minimal degradation upon aging at 85° C. in the dark in inert atmosphere for 50 hours (see FIG. 16). These initial stability tests indicate that there is no rapid photoinduced halide segregation occurring in the wide bandgap composition in the full tandem cell described herein, nor is there rapid ion diffusion between the two perovskite active layers. In FIG. 15D, the normalized EQEs for the subcells of the tandem are plotted along with the absolute reflectance spectrum (wide gap subcell—solid line; low gap subcell—dashed line).

Figure 15E:
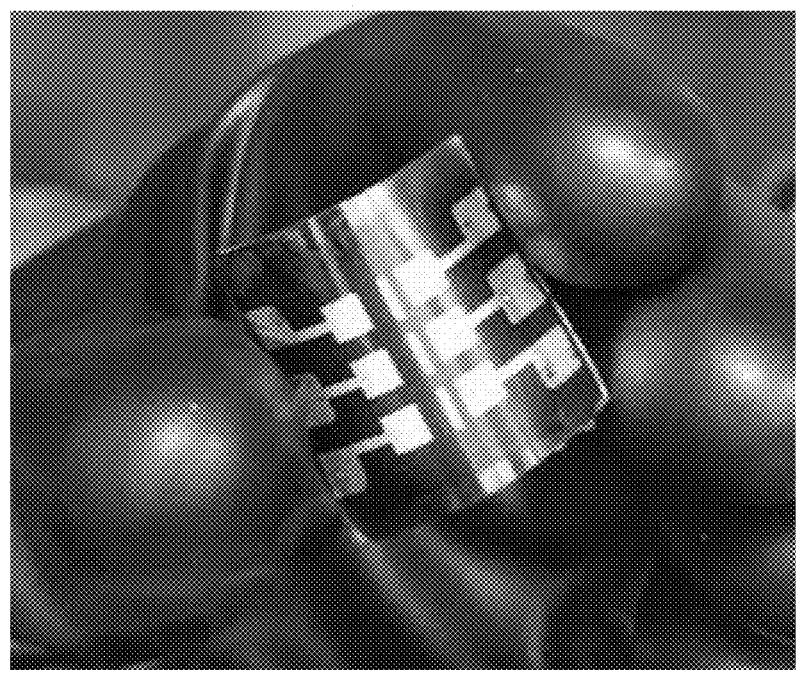
FIG. 15E illustrates a photo of a flexible tandem device that includes a PEIE intervening layer, according to some embodiments of the present disclosure.
Figure 15F:
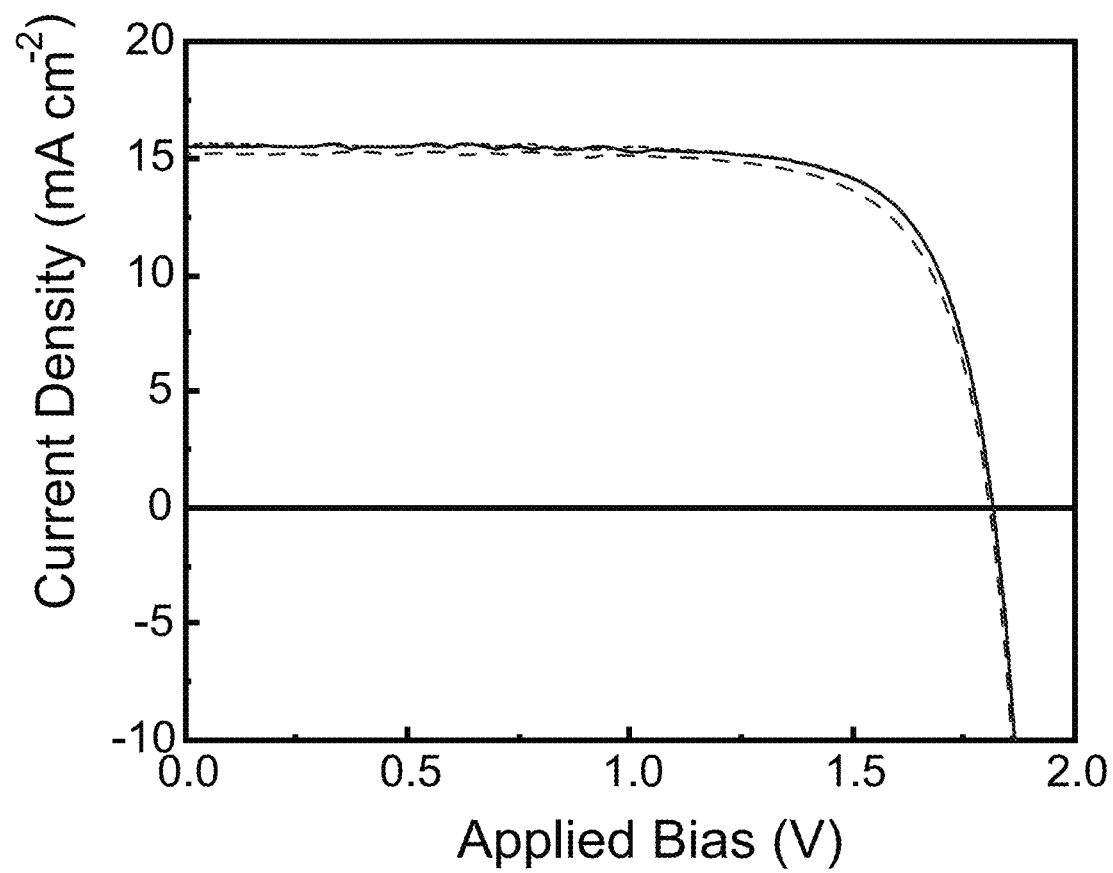
FIG. 15F illustrates current-voltage characteristics for an all-perovskite tandem fabricated on flexible PEN and including a PEIE intervening layer, including current-voltage data after performing 30 and 100 bends with 1.5 cm radius, according to some embodiments of the present disclosure.
Figure 15G:
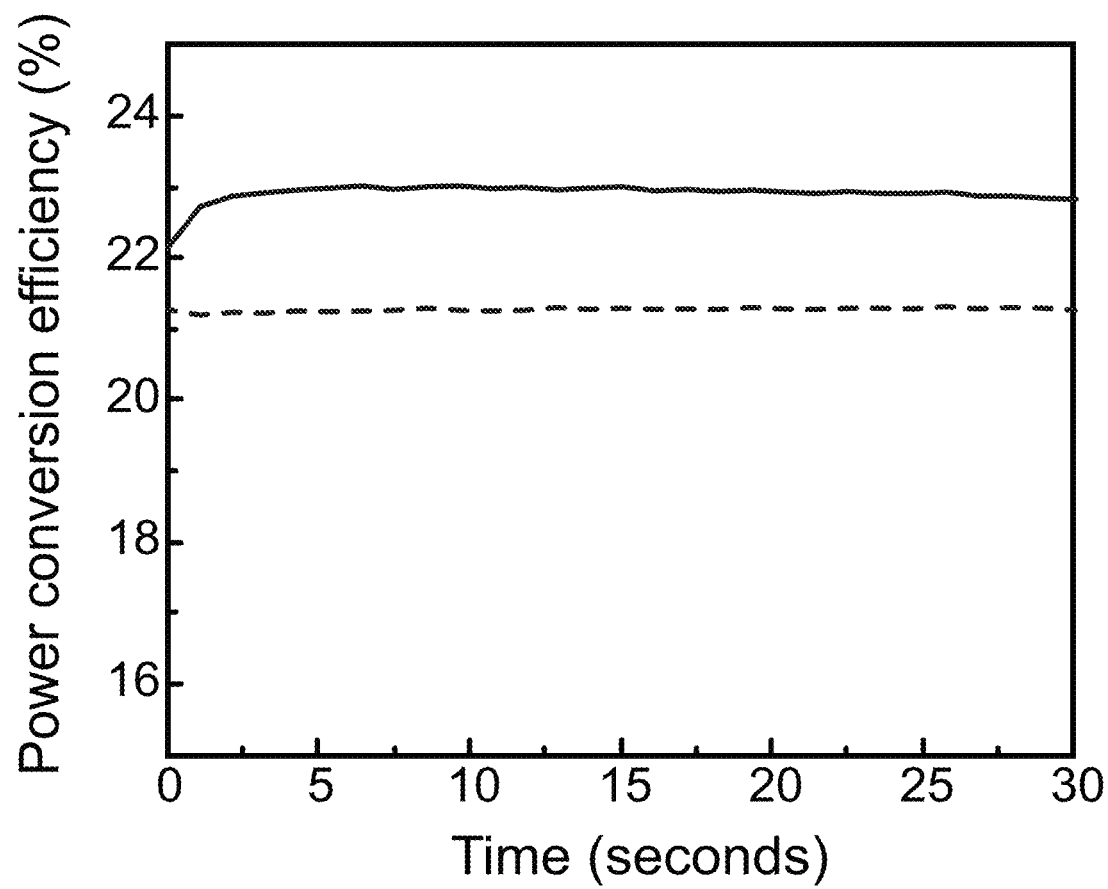
FIG. 15G illustrates maximum power point tracking for the rigid and flexible tandems over 30 seconds, according to some embodiments of the present disclosure.
Figure 15H:
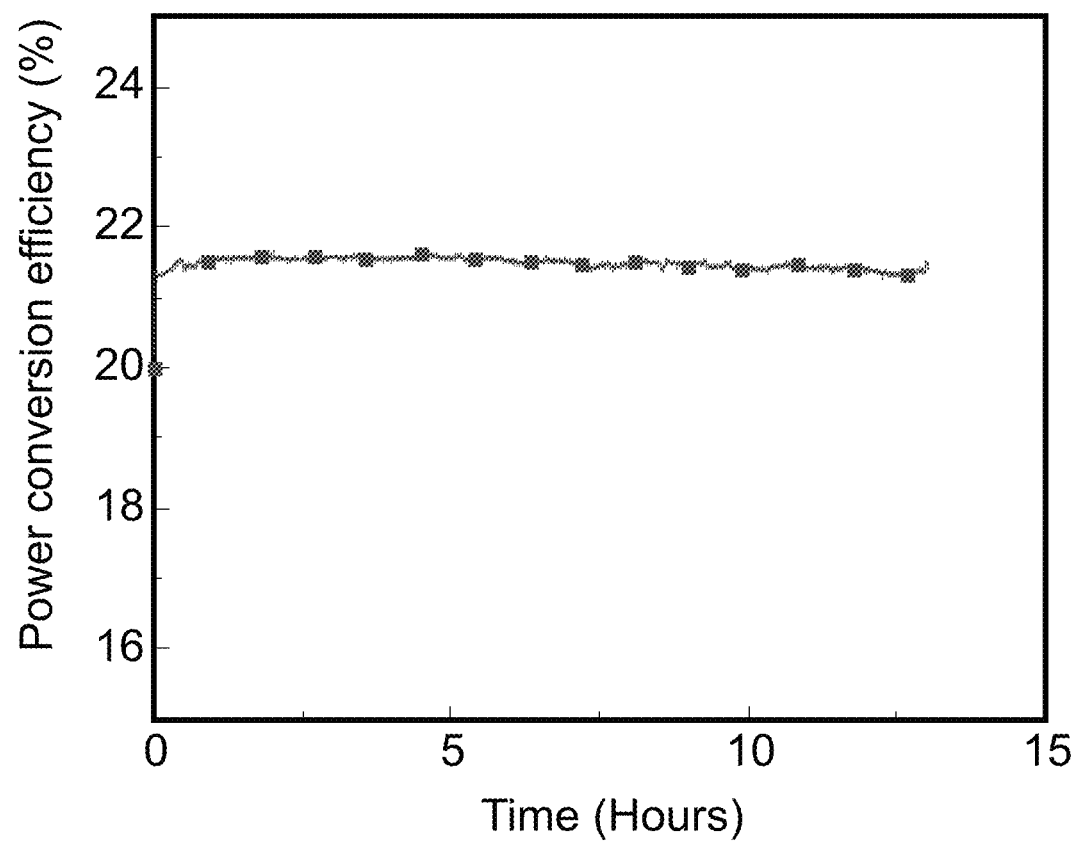
FIG. 15H illustrates longer term maximum power point tracking for a rigid tandem, under AM1.5 illumination for 13 hours, according to some embodiments of the present disclosure.
Figure 16:
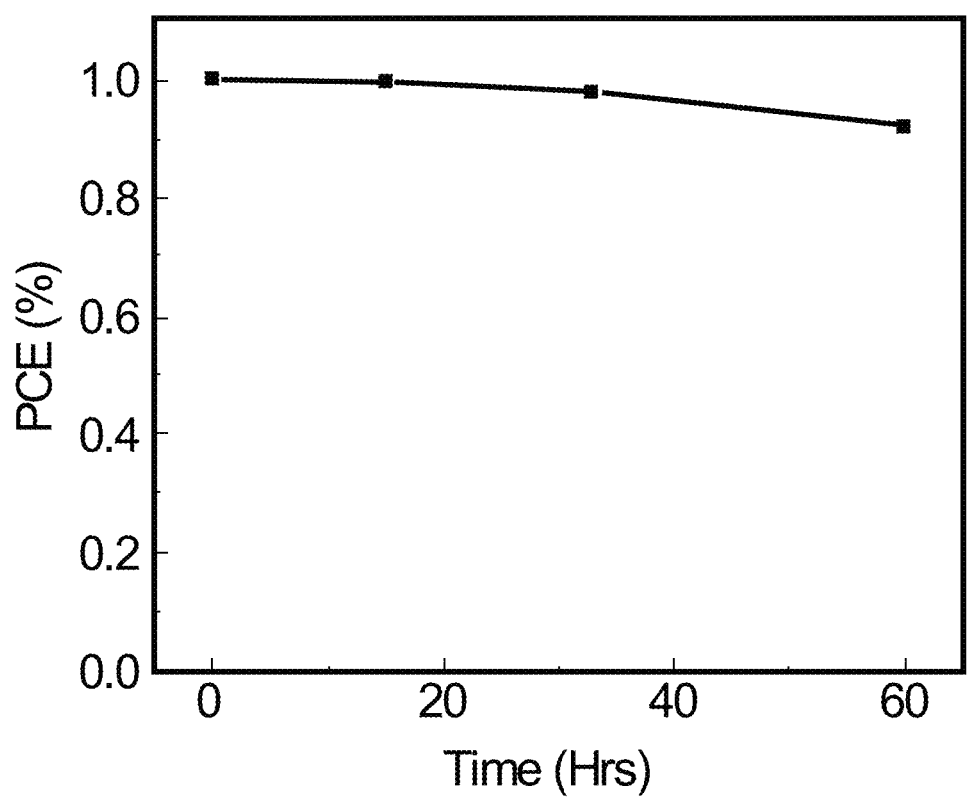
FIG. 16 illustrates tandem aging at 85 C in dark and nitrogen environment for 50 hours, according to some embodiments of the present disclosure.

The highest efficiency flexible thin-film devices (excluding III-V materials) to date are CIGS, with an efficiency of 20.4%. Improving on this maximum efficiency for flexible devices with perovskites would be proof of their utility in low-cost, flexible and lightweight applications. The highest performing flexible perovskite single junction is 18.4%. Taking advantage of the low temperature tandem processing and specifically the thin and flex-compatible recombination layer we developed, the same all-perovskite tandem device stack was fabricated on flexible polyethylene napthalate (PEN) substrates, with 200 nm high-conductivity sputtered IZO as the bottom TCO. FIG. 15E illustrates an example of such a flexible tandem device stack. Current-voltage characteristics for the flexible tandem are shown in FIG. 15F. The flexible tandem on PEN delivered a steady state PCE of 21.3%, a $J_{sc}$ of 15.6 mA/cm2, a $V_{oc}$ of 1.82 V, and a FF of 21.3% (see solid line). This efficiency somewhat improved with 30 bends to 21.4% (line with short dashes) and only dropped to 20.4% after 100 bends at 1.5 cm bend radius (line with long dashes). These results represent the most efficient two terminal all-perovskite tandems reported to date, and the most efficient among non-III-V (low cost) flexible photovoltaics. FIG. 15G illustrates the maximum power point tracking for the rigid (solid line) flexible (dashed line) tandems over 30 seconds. FIG. 15H illustrates longer term maximum power point tracking for such a rigid tandem, under AM1.5 illumination for 13 hours.

The present disclosure also relates to methods for cleaning intervening layers and/or other layers using methods such as exposing a surface of an intervening layer and/or other layer to ultraviolet light and/or an atmosphere containing ozone. As shown herein, such cleaning steps may be employed for creating conformal barrier layers on perovskite layers resulting in perovskite-containing devices having improved physical and performance characteristics. In some embodiments of the present disclosure, a method may include depositing a first layer of aluminum-doped zinc oxide (AZO) and poly(ethylenimine) ethoxylated (PEIE) onto the perovskite, followed by cleaning the first layer using UV-ozone, followed by additional depositing of AZO onto the first layer. The cleaning may oxidize the first AZO surface and any remaining exposed portions of layers 240 or 230 such that the second layer may nucleate move effectively on the first layer, thereby eliminating any pinholes present in the first layer, resulting in a better performing overall barrier layer for the underlying perovskite layer. This treatment may create metal oxide species on any exposed perovskite surfaces, thereby creating a metal oxide intervening layer in its own right.

Figure 17:
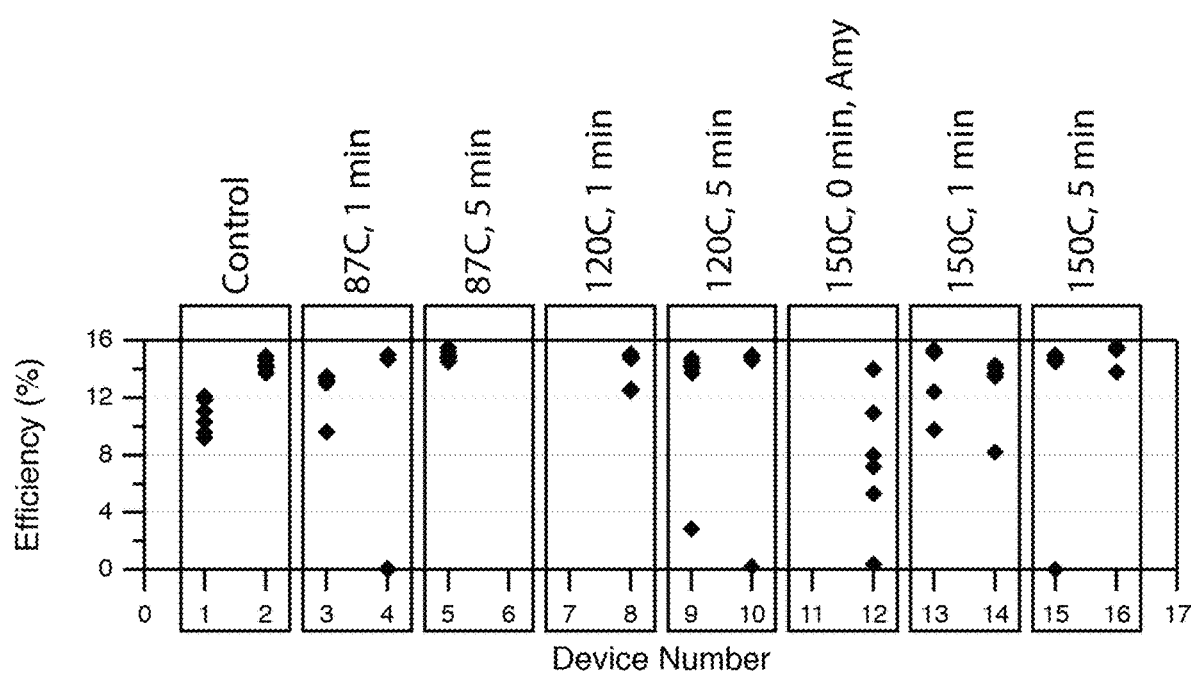
FIG. 17 illustrates the efficiency of various devices having undergone UV-ozone treating and subsequent exposure to a liquid solvent, according to some embodiments of the present disclosure.
Figure 18:
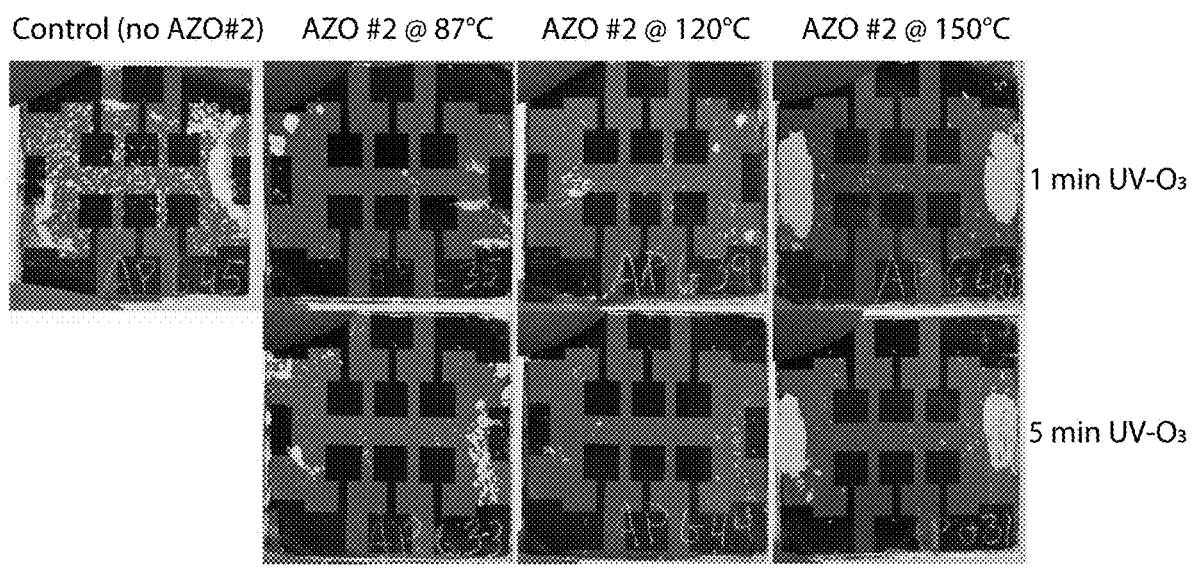
FIG. 18 illustrates photographs of some the devices referred to in FIG. 17, according to some embodiments of the present disclosure.

To test this sixteen device stacks were manufactured, having the architecture of indium tin oxide (ITO)/Poly(N, N'-bis-4-butylphenyl-N,N'-bisphenyl)benzidine (Polytpd)/ Poly [(9,9-bis(3'-(N,N-dimethylamino)propyl)-2,7-fluorene)-alt-2,7-(9,9-dioctylfluorene)] (PFN)/Perovskite/C60 (fullerene)/PEIE/AZO #1/AZO #2/Ag. Fifteen of the sixteen stacks were immersed in dimethylformamide (DMF) solvent at elevated temperatures for defined periods of time, and each device's efficiency was subsequently measured. FIG. 17 illustrates the results, with the first device being a control. FIG. 18 illustrates photographs of such devices. These results indicated that intervening layers, as described herein, UV-ozone treating may provide effective barrier properties to perovskite-containing devices, such as barriers to solvents and/or moisture.

Experimental:

Perovskite precursor solutions: All perovskite precursor chemicals were used as received and stored inside a nitrogen glovebox. Perovskite solution preparation and film deposition was conducted in a nitrogen glovebox.

Low gap perovskite precursor solutions were prepared by dissolving Formamidinium Iodide (Greatcell), Cesium Iodide (Sigma Aldrich), Tin (II) Iodide (Sigma Aldrich or Alfa Aesar, 99.999% beads), and Lead (II) Iodide (Alfa Aesar), to produce a 2M solution of nominal composition $FA_{0.75}Cs_{0.25}Sn_{0.5}Pb_{0.5}I_3$, in anhydrous N,N-dimethylformamide (DMF, Sigma Aldrich) and Dimethylsulfoxide (DMSO, Sigma Aldrich) at a ratio of 3:1 by volume. Additionally, 0.1M of $SnF_2$ (Sigma) was added to the solution to suppress oxidation of tin.

Tandem device fabrication: ITO-coated glass substrates were initially cleaned by sonicating in acetone, propan-2-ol, and then UV ozone treating for 10 mins. PolyTPD (Poly(N, N'-bis-4-butylphenyl-N,N'-bisphenyl)benzidine, 1-material) was coated by spin-coating from a 1 mg/ml solution in anhydrous chlorobenzene, at 4000 rpm for 30 s, depositing the solution dynamically. PFN-Br (poly[(9,9-bis(3'-(N,N-dimethylamino)propyl)-2,7-fluorene)-alt-2,7-(9,9-dioctylfluorene)] was coated as a wetting layer by spin-coating a 0.5 mg/ml solution in anhydrous methanol, at 5000 rpm for 20 s, depositing the solution dynamically.

The wide gap perovskite was deposited by spin-coating the solution described above at 5000 rpm for 60 s, spreading the solution on the substrate before spinning, and depositing anhydrous methyl acetate onto the spinning wet film at 25 seconds into the spin cycle. After finishing spinning, the film is then annealed at 100 C for 60 minutes. Following deposition of the perovskite film, a thin (1 nm) layer of lithium fluoride was then deposited by thermal evaporation at a rate of 0.2 angstrom/s. 30 nm of $C_{60}$ (Lumtec or Sigma-Aldrich) was then deposited by thermal evaporation at a deposition rate of 0.2 angstrom/s for the first 10 nm and 0.5 angstrom/s for the remaining 20 nm.

For single junction wide bandgap cells, a 6 nm layer of bathocuproine (BCP, Sigma) and 120 nm of silver were then deposited to finish the devices, (Kurt J. Lesker) both by thermal evaporation.

For tandems, a thin layer of PEIE (polyethylenimine ethoxylated) was then deposited by spin-coating a 0.025 wt % solution, made up by diluting the purchased PEIE/water solution (Sigma) with anhydrous propan-2-ol. This was spin-coated at 5000 rpm for 20 s, deposited statically before spinning. The films were then annealed at 100 C for 2-3 minutes.

25 nm of AZO was then grown by atomic layer deposition in a Beneq TF S200 ALD system at 85° C. using trimethylaluminum (TMA), diethylzinc (DEZ), and water. Chamber and process nitrogen flows were set to 250 and 450 sccm, respectively. All precursors were unheated and pulsed off of room-temperature vapor pressures. The 25 nm AZO film was deposited with of 3 cycles of $Al_2O_3$ followed by 12 supercycles of AZO; a single AZO supercycle consists of 19 cycles ZnO and 1 cycle $Al_2O_3$. The recipe used for both the $Al_2O_3$ and ZnO cycles proceeded by: a metalorganic (TMA or DEZ, respectively) pulse (0.2 sec), purge (5 sec), $H_2O$ pulse (0.25 sec), and purge (5 sec). Our measured growth rates at 85° C. for $Al_2O_3$ and AZO[19:1] are 1.1 Å/cycle and 20 Å/supercycle, respectively. IZO or ITO were then deposited by sputtering. In the final tandems, a 5 nm layer was used.

ITO was RF sputtered from a ceramic source at room temperature and 25 mTorr with Ar-0.5% O2 mixture flowing at 5 sccm. Low conductivity Indium Zinc Oxide (IZO) was RF sputter deposited from a 2"×11" ceramic target (In: Zn=70:30) at room temperature in an Argon-Oxygen atmosphere (0.75 vol. % O2 in Argon) at a pressure of 5 mTorr using a power of 100 W. For flexible tandem devices IZO was also used as the bottom contact. For this a 200 nm conductive film was deposited in a less oxygen rich argon-oxygen atmosphere (0.15 vol. % O2 in Argon), with the other parameters unchanged from the conditions mentioned above.

PEDOT:PSS was then deposited as the HTL for the low gap subcell. Neutral PEDOT:PSS (Sigma) solution was filtered with a nylon filter (0.4 um pore size) and diluted 1:3 with methanol. This was spin coated in air at 4000 RPM for 20 seconds followed by heating at 140° C. for 10 minutes, after which substrates were immediately transferred into a nitrogen glovebox for low gap perovskite deposition.

The low gap perovskite was deposited by spin-coating the solution described above at 5000 rpm for 80 s, spreading the solution on the substrate before spinning, and depositing anhydrous diethyl ether (Sigma) onto the spinning wet film at 25 seconds into the spin cycle. Films were then annealed at 120 C for 10 mins.

30 nm of C60 (Lumtec or Sigma-Aldrich) was then deposited by thermal evaporation at a deposition rate of 0.2 angstrom/s for the first 10 nm and 0.5 angstrom/s for the remaining 20 nm. Devices were then finished by depositing a 6 nm layer of bathocuproine (BCP, Sigma) and 120 nm of either silver or gold, (Kurt J. Lesker) both by thermal evaporation.

Single junction low bandgap devices were made in the structure ITO/PEDOT:PSS/low gap perovskite/C60/BCP/Ag by using the processes described above, but the low gap material was deposited differently—diethyl ether was dripped onto the film at 35 s after starting the spin cycle, and annealing was carried out at 100 C for 10 mins.

Current-voltage characteristics measurement: Solar cells were tested on an Oriel Sol3A class AAA solar simulator from Newport inside a nitrogen glovebox, using a shadow mask with aperture area 0.058 cm$^2$. For single junctions, lamp intensity was calibrated using short-circuit current produced in a calibrated KG2-filtered silicon photodiode. By measuring the external quantum efficiency curve of the solar cell (conducted on a Newport system in ambient air), the spectral mismatch factor was calculated and used to appropriately adjust the intensity of the solar simulator lamp to provide one sun illumination.

For tandems, it is important that both subcells experience the same mismatch factor, so neither subcell is artificially over- or under-illuminated compared to the real one sun condition. In order to achieve this, we had to restrict the amount of infra-red illumination coming from our xenon bulb. This was achieved by employing a 950 nm cutoff filter (Thorlabs) in the illumination path. Based on this modification of the simulator spectrum, and using the EQE spectra of each subcell, we calculated the mismatch factors to be 3% and 1.5% for the wide and low gap subcells respectively. We thus set the lamp intensity to correspond to the 1.5% mismatch, meaning that the wide gap cell was only over-saturated by 1.5%. We verified that the currents measured in our system were accurate by using a second solar simulator system normally used to measure III-V multi junction devices, that uses an array of different colored LEDs to change the spectrum of a xenon lamp in order to eliminate mismatch between subcells. The current attained on both systems matched well.

External quantum efficiency measurement: EQE spectra were measured on a custom-built system equipped with an array of LEDs of various wavelengths. To measure EQE for each subcell, the other subcell was light biased with these LEDs to saturate it, and a voltage applied across the device to balance that which would be produced by the biased subcell. Current was measured using a Stanford SRS 830 lock-in, with the excitation light provided by a monochromated xenon lamp, chopped at 300 Hz, and a reference diode measured simultaneously. Specular reflectance was measured at the same time, with no bias LED light applied, using a photodiode mounted near the sample.

Device efficiency measurement: The normalized EQEs were used, together with the solar simulator spectrum, to calculate the mismatch per subcell and consequently adjust the solar simulator spectrum using a filter so that each subcell was operated with minimal mismatch. The methodology of adjusting the solar simulator spectral shape to ensure low mismatch between the two subcells is adapted from standard practice in the long existing III-V multijunction community. In addition, the Jsc measured under the solar simulator (when correctly calibrated) is preferred over measurements of the absolute EQEs because they are not affected by leakage current between subcells or light bias and frequency-dependent collection efficiencies Stability measurements: Ambient: Solar cells were loaded into a custom-built degradation testing setup. The setup consists of cooling tubes to keep the cell housing at room temperature, electrical housing, and electronics that switch between devices, measures JV curves, and holds the devices under resistive load, and a light source to provide constant illumination. In this study, devices were kept in air underneath a sulfur plasma lamp at ~0.8 suns and held under a resistive load of 510 Ohms. Every 30 minutes, the system removes the resistive load and takes a JV scan using a Keithley 2450 source-measure unit. JV curves are then analyzed to extract relevant parameters.

Nitrogen: Solar cells were tested in inert atmosphere using a similar setup, with the main difference that cells were loaded in sealed flow chambers with nitrogen constantly flowing through them.

Lifetime and mobility measurements: For the TRMC measurements, the perovskite was deposited onto quartz substrates (2.5 cm$^2$ area). The samples are pumped with a 5 ns pulse width beam (650 nm) from an OPO pumped by the third harmonic of an Nd:YAG laser and probed by microwaves at around 9 GHz. The microwave field is absorbed by photogenerated mobile carriers in the perovskite, and its relative change in power $\Delta P$ can be measured. The change in microwave power relates to the photoconductivity $\Delta G$ through $\Delta P/P = -K\Delta G$ where K is an empirically determined calibration factor for the microwave cavity used in this experiment. The photoconductivity is proportional to the number of charges and their mobility. It can be expressed as $\Delta G = e\beta F_A I_0 (\phi \Sigma \mu)$ where e is the elementary charge, $\beta=2.2$ is the geometric factor for the X-band waveguide used, $I_0$ is the incident photon flux, $F_A$ the fraction of light absorbed at the excitation wavelength, $\phi$ is the quantum efficiency of free carrier generation per photon absorbed and $\Sigma\mu=\mu_e+\mu_h$ the sum of the mobilities of electrons and holes. Bi-exponential fits of the photoconductivity decay transients were weighted to calculate the average carrier lifetime using the equation: $\tau_{avg}=(A_0\tau_0+A_1\tau_1)/(A_0+A_1)$.

Atomic force microscopy: Atomic force microscopy images were measured with a commercial Park XE-70 AFM setup in an acoustic box with air table vibration isolation. Measurements were made in intermittent-contact mode using Budget Sensors Tapp300Al-G cantilevers.

Transmission electron microscopy: Transmission electron microscopy (TEM) imaging was conducted using an FEI Tecnai ST30 microscope at 300 keV with a Gatan camera. Samples were prepared on a 300 mesh copper TEM grid (EMS) coated with a 5-6 nm amorphous carbon film by mounting the TEM grid to a glass slide with kapton tape, evaporating 5 nm of $C_{60}$, and depositing AZO by ALD.

Energy-dispersive X-ray spectroscopy (EDX) measurements were taken on the same microscope using an Ametek EDX system with the sample at an alpha tilt of 20°.

Water vapor transmission rate (WVTR): Water vapor transmission rate measurements were performed using a calcium test in a damp heat oven at 45° C. and 80% relative humidity. Barriers were deposited on top of a flexible polyethylene terephthalate substrate with sample area defined by a metal spacer and butyl seal to be 5.47 cm$^2$. A calcium test card with conductive calcium channels formed the back seal on the metal spacer. The change in calcium channel conductivity was used to measure moisture ingress and WVTR.

Example Set 1

Example 1

A device comprising: a first layer comprising at least one of a semiconducting material, a hole transport material (HTM), or an electron transport material (ETM); a second layer; and a third layer comprising a material that is at least one of transparent or conductive, wherein: the second layer is positioned between the first layer and the third layer, the first layer, the second layer, and the third layer are in electrical contact with each other, the third layer has a first thickness between greater than zero nm and about 500 nm, and the second layer results in the device having at least one improved physical property or performance metric.

Example 2

The device of Example 1, wherein the first thickness is between greater than zero nm and about 100 nm.

Example 3

The device of Example 2, wherein the first thickness is between greater than zero nm and about 50 nm.

Example 4

The device of Example 1, wherein the semiconducting material comprises at least one of silicon, copper, indium, gallium, selenium, cadmium, tellurium, or an organic material.

Example 5

The device of Example 4, wherein the semiconducting material comprises a perovskite.

Example 6

The device of Example 5, wherein the perovskite is defined by the formula $ABX_3$, wherein A is a first cation, B is a second cation, and X is an anion.

Example 7

The device of Example 6, wherein A comprises at least one of methylammonium or cesium.

Example 8

The device of Example 6, wherein A comprises at least one of lead or tin.

Example 9

The device of Example 6, wherein X comprises a halogen.

Example 10

The device of Example 1, wherein the HTM comprises at least one of PEDOT:PSS or an oxide.

Example 11

The device of Example 10, wherein the HTM comprises at least one of poly(bis(4-phenyl)(2,4,6-triphenyl)amine (PTAA), 2,2',7,70-tetrakis-(N,N-di-4-methoxyphenylamino)-9,9-spirobifluorene (Spiro-OmeTAD), poly(3,4-ethylene dioxythiophene) polystyrene sulfonate polymer (PEDOT:PSS), Poly (3-hexylthiophene) (P3HT), Poly (3-hexylthiophene) (P3HT), poly tri-arylamine (PTAA), poly(N,N'-bis-4-butylphenyl-N,N'-bisphenyl)benzidine, poly[(9,9-bis(3'-(N,N-dimethylamino)propyl)-2,7-fluorene)-alt-2,7-(9,9-dioctylfluorene), a pyrene, thiophene, 1-(N,N-di-p-methoxyphenylamine) pyrene, 4,4'-cyclohexylidenebis[N,N-bis(4-methyl phenyl) benzenamine], 2,5-bis (4,4'-bis(methoxyphenyl) aminophen-4"-yl)-3,4-ethylene dioxythiophene, 2,3,4,5-tetra[4,4'-bis(methoxyphenyl) aminophen-4"-yl]-thiophene, 4,4',5,5'-tetra[4,4'-bis(methoxyphenyl)aminophen-4"-yl]-2,2'-bithiophene, 5,10,15,20-tetrakis(4-bromophenyl) porphyrin, 5,10,15,20-tetrakis(5-bromopyridine-2-yl) porphyrin, 5,10,15,20-tetrakis(4-bromophenyl) porphyrin zinc(II), 5,10,15,20-tetrakis(5-bromopyridine-2-yl) porphyrin zinc(II), and/or 1,3,6,8-tetra(N,N-p-dimethoxyphenylamino)-9-ethylcarbazole, graphene oxide, copper pthalocyanine, 2,2',7,7'-Tetra(N,N-di-p-tolyl)amino-9,9-spirobifluorene (spiro-TTB), carbon nanotubes, nickel oxide, copper oxide, copper indium sulfide, copper thiocyanate, copper chromium iodide, copper iodide, vanadium oxide, tin oxide, aluminum oxide, zinc telluride, cobalt zinc oxide, or tungsten oxide.

Example 12

The device of Example 1, wherein the ETM comprises at least one of a structured carbon, an oxide, LiF, calcium carbonate, or an organic molecule.

Example 13

The device of Example 12, wherein the structured carbon comprises at least one of graphene, a carbon nanotube, a fullerene, or a fullerene derivative.

Example 14

The device of Example 12, wherein the oxide comprises at least one of zinc oxide, magnesium oxide, indium oxide, niobium oxide, tungsten oxide, tin oxide, titanium dioxide, zinc oxide, or vanadium oxide.

Example 15

The device of Example 12, wherein the organic molecule comprises at least one of bathocuproine, [6,6]-phenyl $C_{61}$ butyric acid methyl ester, a naphthalene diimide, a perylene diimide, an electron accepting diimide, an electron accepting dianhydride, a pyromellitic anhydride, or an azaacene-based molecule.

Example 16

The device of Example 1, wherein the material of the third layer comprises at least one of indium, tin, aluminum, cadmium, zinc, gallium, fluorine, silver, gold, molybdenum, bismuth, nickel, chromium, antimony, or copper.

Example 17

The device of Example 16, wherein the material of the third layer is an oxide.

Example 18

The device of Example 17, wherein the material of the third layer is a zinc oxide.

Example 19

The device of Example 1, wherein the third layer was deposited by a vapor phase method.

Example 20

The device of Example 19, wherein the vapor phase method comprises at least one of chemical vapor deposition, atomic layer deposition, metal organic chemical vapor deposition, thermal evaporation, pulsed laser deposition, vapor transport deposition, sputter deposition, or molecular layer deposition.

Example 21

The device of Example 1, wherein the second layer comprises a functional group comprising at least one of a hydroxyl group or an amine.

Example 22

The device of Example 21, wherein the functional group comprises at least one of a hydroxyl group, an amine, an alkane, an alkene, an alkyne, an aromatic, a thiol, a phosphate, an imine, a carboxylic acid, an amide, an ester, an acyl phosphate, a nitrile, a halide, an ether, a ketone, a sulfide, an acid halide, an acid anhydride, an epoxide, or a nitro functional group.

Example 23

The device of Example 1, wherein the second layer comprises at least one of an alkane, an alkene, an alkyne, an aromatic, a hydroxyl, a carbonyl, an ether, and ester, an oxide, thiol, an amine, a phosphate, a sulphate, an imine, a carboxylic acid, a sulfuric acid, an amide, an ester, an acyl phosphate, a nitrile, a halide, an ether, a ketone, a sulfide, an acid halide, an acid anhydride, an epoxide, or a nitro functional group.

Example 24

The device of Example 1, wherein: the second layer comprises $$H_2N\overset{R}{\frown}OH,$$

and R comprises at least one of an organic component or an inorganic component.

Example 25

The device of Example 1, wherein: the second layer comprises $$\left[\begin{array}{c}\\ \\ \underset{R}{N}\\ \end{array}\right]_n,$$

R comprises at least one of $-CH_2CH_2NR'_2$, $-H$, or $-CH_2CH_2OH$, R' comprises at least one of a hydrocarbon, oxygen, nitrogen, sulfur, or a halogen, and n is between 1 and 100,000.

Example 26

The device of Example 1, wherein the second layer comprises at least one of poly(ethylenimine) ethoxylated (PEIE) or an acid anhydride.

Example 27

The device of Example 1, wherein the second layer is derived from a metal halide.

Example 28

The device of Example 27, wherein the metal halide comprises at least one of a tin halide, a zinc halide, a titanium halide, or a lead halide.

Example 29

The device of Example 28, wherein the tin halide comprises at least one of $SnI_2$, $SnF_2$, $SnBr_2$, $SnCl_2$, $SnI_4$, $SnBr_4$, $SnCl_4$, or $SnF_4$.

Example 30

The device of Example 1, wherein: the second layer is derived from at least one of $Si(OR^1)_3R^2$, $SiX_3R^2$, or $PO_3H_2R^2$; $R^1$ and $R^2$ comprise at least one of an alkyl group, an amine, an amide, a carboxylic acid group, or a sulfide, and X comprises a halogen.

Example 31

The device of Example 1, wherein the second layer comprises at least one of choline chloride, an amino acid, glycine, 5-aminovaleric acid, methyl violagen, tyramine, or an amine-containing compound.

Example 32

The device of Example 31, wherein the amine-containing compound further comprises at least one of an alkane, an alkene, an alkyne, an aromatic, a hydroxyl, a thiol, an amine, a phosphate, an imine, a carboxylic acid, an amide, an ester, an acyl phosphate, a nitrile, a halide, an ether, a ketone, a sulfide, an acid halide, an acid anhydride, an epoxide, or a nitro functional group.

Example 33

The device of Example 1, wherein the second layer has a second thickness between greater than zero nanometers and about 10 nanometers.

Example 34

The device of Example 33, wherein the second thickness is between greater than zero nanometers and about 5 nanometers.

Example 35

The device of Example 34, wherein the first thickness is about one nanometer.

Example 36

The device of Example 1, further comprising: a fourth layer comprising at least one of a second semiconducting material, a second HTM, or a second ETM, wherein: the third layer is positioned between the second layer and the fourth layer, the first layer, the second layer, the third layer, and the fourth layer are electrically connected.

Example 37

The device of Example 36, wherein the third layer has an electrical sheet resistance laterally across the plane of the third layer between 1 KOhm/sq and 10 MOhm/sq.

Example 38

The device of Example 37, wherein the electrical sheet resistance is between 50 KOhm/sq and 3 MOhm/sq.

Example 39

The device of Example 1, wherein the improved physical property or performance metric comprises improved bonding of the third layer to the second layer as demonstrated by a shift in at least one of an oxygen peak, a metal peak, or a carbon peak, as detected by X-ray photoelectron spectroscopy.

Example 40

The device of Example 1, wherein the improved physical property or performance metric comprises improved bonding of the third layer to the second layer as measured by Auger electron spectroscopy.

Example 41

The device of Example 1, wherein the improved physical property or performance metric comprises improved bonding of the third layer to the second layer as measured by transmission electron spectroscopy.

Example 42

The device of Example 1, wherein the improved physical property or performance metric comprises improved bonding of the third layer to the second layer as measured by X-ray fluorescence spectroscopy.

Example 43

The device of Example 1, wherein the improved physical property or performance metric comprises improved bonding of the third layer to the second layer as demonstrated by emersion of the device in pure dimethylformamide for about 30 seconds at about room temperature.

Example 44

The device of Example 43, wherein the improved physical property or performance metric remains after the emersion and subsequent drying at 100° C. for about 5 minutes.

Example 45

The device of Example 1, wherein: the first layer comprises a fullerene; the second layer comprises at least one poly(ethylenimine) ethoxylated (PEIE) or an acid anhydride; and the material of the third layer comprises a metal oxide.

Example 46

The device of Example 45, further comprising a fourth layer comprising a perovskite, wherein the first layer is positioned between the second layer and the fourth layer.

Example 47

The device of Example 1, wherein: the first layer comprises a perovskite; the second layer comprises at least one of poly(ethylenimine) ethoxylated (PEIE) or an acid anhydride; and the material of the third layer comprises a metal oxide.

Example Set 2

Example 1

A device comprising, in order: a first layer comprising a perovskite; a second layer comprising a fullerene; a third layer comprising poly(ethylenimine) ethoxylated (PEIE); and a fourth layer comprising aluminum-doped zinc oxide or tin dioxide.

Example 2

The device of Example 1, further comprising: a fifth layer comprising silver, wherein: the fourth layer is positioned between the fifth layer and the third layer.

Example 3

The device of Example 1, further comprising: a fifth layer comprising indium zinc oxide or indium tin oxide, wherein: the fourth layer is positioned between the fifth layer and the third layer.

Example 4

The device of Example 3, further comprising: a sixth layer comprising poly[bis(4-phenyl)(2,4,6-trimethylphenyl) amine, wherein: the first layer is positioned between the sixth layer and the second layer.

Example 5

The device of Example 4, further comprising: a seventh layer comprising indium tin oxide or indium zin oxide, wherein: the sixth layer is positioned between the seventh layer and the first layer.

Example 6

The device of Example 5, further comprising: an eighth layer comprising glass, PET, or PEN, wherein: the seventh layer is positioned between the eighth layer and the sixth layer.

Example 7

The device of Example 3, further comprising: a ninth layer comprising silver, wherein: the fifth layer is positioned between the ninth layer and the fourth layer.

Example 8

The device of example 5, where layers 1-7 make up part of a multi junction solar cell.

Example 9

The device of example 8, where the other subcell(s) of the multi-junction device comprise at least one of: a metal halide perovskite with a different bandgap than layer 1, CIGS, or Si.

Example Set 3

Example 1

A method comprising: exposing a first layer to at least one of ozone or ultraviolet light; and a first depositing of a second layer onto the first layer, wherein: the second layer comprises a metal oxide, and the second layer has a thickness between greater than zero nm and 500 nm or between greater than zero nm and 50 nm.

Example 2

The method of Example 1, wherein the first layer comprises a carbon-containing material.

Example 3

The method of Example 2, wherein the carbon-containing material comprises at least one of a fullerene, graphene, or a carbon nanotube.

Example 4

The method of Example 1, wherein the first layer comprises a material comprising a functional group comprising at least one of a hydroxyl group or an amine.

Example 5

The method of Example 4, wherein the functional group further comprises at least one of an alkane, an alkene, an alkyne, an aromatic, a thiol, a phosphate, an imine, a carboxylic acid, an amide, an ester, an acyl phosphate, a nitrile, a halide, an ether, a ketone, a sulfide, an acid halide, an acid anhydride, an epoxide, or a nitro functional group.

Example 6

The method of Example 1, wherein: the first layer comprises

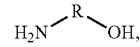

and R comprises at least one of an organic component or an inorganic component.

Example 7

The method of Example 1, wherein: the first layer comprises

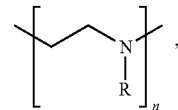

R comprises at least one of $-CH_2CH_2NR'_2$, $-H$, or $-CH_2CH_2OH$, R' comprises at least one of a hydrocarbon, oxygen, nitrogen, sulfur, or a halogen, and n is between 1 and 100,000.

Example 8

The method of Example 1, wherein the first layer comprises poly(ethylenimine) ethoxylated (PEIE).

Example 9

The method of Example 1, wherein the first layer is derived from a metal halide.

Example 10

The method of Example 9, wherein the metal halide comprises at least one of a tin halide, a zinc halide, a titanium halide, or a lead halide.

Example 11

The method of Example 10, wherein the tin halide comprises at least one of $SnI_2$, $SnF_2$, $SnBr_2$, $SnCl_2$, $SnI_4$, $SnBr_4$, $SnCl_4$, or $SnF_4$.

Example 12

The method of Example 1, wherein: the first layer is derived from at least one of $Si(OR^1)_3R^2$, $SiX_3R^2$, or $PO_3H_2R^2$; $R^1$ and $R^2$ comprise at least one of an alkyl group, an amine, an amide, a carboxylic acid group, or a sulfide, and X comprises a halogen.

Example 13

The method of Example 1, wherein: the first layer comprises at least one of choline chloride, an amino acid, glycine, 5-aminovaleric acid, methyl violagen, tyramine, or an amine-containing compound.

Example 14

The method of Example 13, wherein the amine-containing compound further comprises at least one of an alkane, an alkene, an alkyne, an aromatic, a hydroxyl, a thiol, an amine, a phosphate, an imine, a carboxylic acid, an amide, an ester, an acyl phosphate, a nitrile, a halide, an ether, a ketone, a sulfide, an acid halide, an acid anhydride, an epoxide, or a nitro functional group.

Example 15

The method of Example 1, wherein the first depositing is by a vapor phase method.

Example 16

The method of Example 15, wherein the vapor phase method comprises at least one of chemical vapor deposition, atomic layer deposition (ALD), metal organic chemical vapor deposition, thermal evaporation, pulsed laser deposition, vapor transport deposition, sputter deposition, or molecular layer deposition.

Example 17

The method of Example 16, wherein the vapor phase method is ALD.

Example 18

The method of Example 1, further comprising, prior to the first depositing, an initial depositing of the first layer onto a perovskite layer.

Example Set 4

Example 1

A device comprising: a first layer comprising a perovskite; a second layer comprising a first metal oxide; and a third layer comprising a second metal oxide, wherein: the second layer is between the first layer and the third layer, the first layer, the second layer, and the third layer are in electrical contact with each other, the second layer has a first thickness between greater than zero nm and 50 nm or between 2 and 30 nm, the third layer has a second thickness between greater than zero nm and 250 nm or between 2 and 30 nm.

Example 2

The device of Example 1, further comprising a resistance to immersion in pure dimethylformamide for at least 1 minute at room temperature.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. A device comprising, in order:
  a first layer comprising a perovskite;
  a second layer comprising an electron transport material (ETM);
  a third layer comprising poly(ethylenimine) ethoxylated;
  a fourth layer comprising a metal oxide deposited directly on the third layer, wherein:
  the first layer, the second layer, the third layer, and the fourth layer are in electrical contact with each other,
  the third layer has a thickness between greater than zero nanometers and about 10 nm,
  the fourth layer has a thickness between greater than zero nm and about 50 nm, and
  the ETM comprises at least one of a structured carbon or an organic molecule.

2. The device of claim 1, wherein the metal oxide comprises at least one of zinc oxide, titanium oxide, aluminum oxide, gallium oxide, or tin oxide.

3. The device of claim 1, wherein the fourth layer has an electrical sheet resistance laterally across the plane of the fourth layer between 1 KOhm/sq and 10 MOhm/sq.

4. The device of claim 1, wherein the third layer results in the device having at least one improved physical property or performance metric.

5. The device of claim 4, wherein the improved physical property or performance metric comprises improved bonding of the fourth layer to the second layer as demonstrated by a shift in at least one of an oxygen peak, a metal peak, or a carbon peak, as detected by X-ray photoelectron spectroscopy.

6. The device of claim 4, wherein the improved physical property or performance metric comprises improved bonding of the fourth layer to the second layer as demonstrated by emersion of the device in pure dimethylformamide for about 30 seconds at about room temperature.

7. The device of claim 1, wherein the ETM comprises a fullerene.

8. The device of claim 1, further comprising:
  a fifth layer comprising a perovskite, wherein:
  fourth layer is positioned between the third layer and the fifth layer,
  the first perovskite has a first bandgap, and
  the second perovskite has a second band gap that is different from the first bandgap.

9. The device of claim 2, wherein the zinc oxide is doped with at least one of aluminum or indium.

10. The device of claim 1, wherein the device is flexible.

* * * * *